(12) United States Patent
Jeong et al.

(10) Patent No.: US 10,727,870 B2
(45) Date of Patent: Jul. 28, 2020

(54) METHOD AND APPARATUS FOR ENCODING AND DECODING LOW DENSITY PARITY CHECK CODES

(71) Applicant: SAMSUNG ELECTRONICS CO., LTD., Suwon-si (KR)

(72) Inventors: Hong-sil Jeong, Suwon-si (KR); Se-ho Myung, Yongin-si (KR); Kyung-joong Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/356,414

(22) Filed: Mar. 18, 2019

(65) Prior Publication Data

US 2019/0215010 A1 Jul. 11, 2019

Related U.S. Application Data

(63) Continuation of application No. 15/722,335, filed on Oct. 2, 2017, now Pat. No. 10,236,911, which is a
(Continued)

(51) Int. Cl.
*H03M 13/00* (2006.01)
*H03M 13/11* (2006.01)
*H03M 13/25* (2006.01)

(52) U.S. Cl.
CPC .... *H03M 13/1165* (2013.01); *H03M 13/1185* (2013.01); *H03M 13/255* (2013.01)

(58) Field of Classification Search
None
See application file for complete search history.

(56) References Cited

U.S. PATENT DOCUMENTS

2014/0372825 A1* 12/2014 Jeong .................. H03M 13/255
  714/752
2015/0095744 A1* 4/2015 Jeong ................ H03M 13/2703
  714/776
(Continued)

OTHER PUBLICATIONS

P. Saunders and A. D. Fagan, "A High Speed, Low Memory FPGA Based LDPC Decoder Architecture for Quasi-Cyclic LDPC Codes," 2006 International Conference on Field Programmable Logic and Applications, Madrid, 2006, pp. 1-6. (Year: 2006).*

*Primary Examiner* — Daniel F. McMahon
(74) *Attorney, Agent, or Firm* — Sughrue Mion, PLLC

(57) ABSTRACT

A transmitting apparatus encodes information bits using a low density parity check (LDPC) encoder, which is configured to encode information bits to generate parity bits based on a parity check matrix. In some embodiments, the code rate is 8/15 and the code length is 64800. The transmitting apparatus also includes an interleaver configured to interleave an LDPC codeword including the information bits and parity bits and a mapper configured to map the interleaved LDPC codeword onto constellation points. In some embodiments, the parity check matrix comprises an information matrix part corresponding to the information bits and a parity matrix part corresponding to the parity bits. In some embodiments, the information matrix part is defined by a specific table indicating indices of rows at which a value "1" is positioned in a 0-th column of an i-th column group in the parity check matrix.

2 Claims, 14 Drawing Sheets

Related U.S. Application Data continuation of application No. 14/716,053, filed on May 19, 2015, now Pat. No. 9,787,326.

(56) References Cited

U.S. PATENT DOCUMENTS

| | | | |
|---|---|---|---|
| 2015/0100845 A1* | 4/2015 | Myung | H03M 13/2778 714/752 |
| 2015/0121176 A1* | 4/2015 | Myung | H04L 1/0041 714/776 |
| 2015/0128005 A1* | 5/2015 | Jeong | H03M 13/036 714/752 |
| 2015/0236721 A1* | 8/2015 | Kim | H04L 1/0041 714/776 |
| 2015/0236816 A1* | 8/2015 | Myung | H03M 13/271 714/776 |
| 2015/0270853 A1* | 9/2015 | Jeong | H03M 13/2792 714/752 |
| 2016/0164540 A1* | 6/2016 | Shinohara | H03M 13/2792 714/752 |
| 2016/0211868 A1* | 7/2016 | Shinohara | H03M 13/1165 |
| 2016/0233886 A1 | 8/2016 | Jeong et al. | |
| 2016/0233891 A1 | 8/2016 | Myung et al. | |
| 2016/0233893 A1 | 8/2016 | Kim et al. | |

* cited by examiner

-- RELATED ART --

METHOD AND APPARATUS FOR ENCODING AND DECODING LOW DENSITY PARITY CHECK CODES

CROSS-REFERENCE TO THE RELATED APPLICATION

This is a continuation of U.S. application Ser. No. 15/722,335 filed Oct. 2, 2017 (now U.S. Pat. No. 10,236,911 issued Mar. 19, 2019), which is a continuation of U.S. application Ser. No. 14/716,053 filed May 19, 2015 (now U.S. Pat. No. 9,787,326 issued Oct. 10, 2017). The disclosures of the above are hereby incorporated by reference herein in their entirety.

BACKGROUND

1. Field

Apparatuses and methods consistent with the exemplary embodiments of the inventive concept relate to encoding and decoding Low Density Parity Check (LDPC) codes, and more particularly, to encoding and decoding LDPC codes which perform LDPC encoding and decoding based on a parity-check matrix.

2. Description of the Related Art

In a communication/broadcasting system, link performance may considerably deteriorate due to various types of noises, a fading phenomenon, and inter-symbol interference (ISI) of a channel. Therefore, to implement high-speed digital communication/broadcasting systems requiring high data throughput and reliability like next-generation mobile communications, digital broadcasting, and portable Internet, it has been required to develop technologies to overcome the noises, the fading, and the inter-symbol interference. As part of studies to overcome the noises, etc., a study on an error-correcting code which is a method for increasing reliability of communications by efficiently recovering distorted information has been actively conducted recently. LDPC codes which were first introduced by Gallager in the 1960s remain forgotten for a very long time due to complexity which could hardly be implemented at the technology level at that time. However, as performance of turbo codes proposed by Berrou, Glavieux, and Thitimajshima in 1993 approaches Shannon's channel capacity, many studies on channel encoding based on iterative decoding and a graph thereof by performing many different interpretations on performance and characteristics of the turbo codes have been conducted. As a result, as the LDPC codes in the late 1990s are restudied, when the LDPC codes are decoded by applying sum-product algorithm based iterative decoding to the LDPC codes on a tanner graph corresponding to the LDPC codes, it was found that the performance of the LDPC codes approaches the Shannon's channel capacity.

The LDPC codes may be generally defined by a parity-check matrix and represented using a bipartite graph commonly referred to as the tanner graph.

Hereinafter, a systematic LDPC codeword will be described with reference to FIG. 1. The LDPC codes are LDPC encoded by receiving an information word 102 formed of $K_{ldpc}$ bits or symbols to generate a codeword 100 formed of $N_{ldpc}$ bits or symbols. Hereinafter, for convenience of explanation, it is assumed that the codeword 100 formed of $N_{ldpc}$ bits is generated by receiving the information word 102 including $K_{ldpc}$ bits. That is, when the information word $I=[i_0, i_1, i_2, \ldots, i_{K_{ldpc}-1}]$ 102 which is formed of $K_{ldpc}$ input bits is LDPC encoded, the codeword $c=[c_0, c_1, c_2, c_3, \ldots, c_{N_{ldpc}-1}]$ 100 is generated. That is, the codeword is a bit string formed of a plurality of bits and the bits of the codeword represent each bit forming the codeword. Further, the information word is a bit string formed of a plurality of bits and the bits of the information word represent each bit forming the information word. In this case, in the case of a systematic code, the codeword is formed of $c=[c_0, c_1, c_2, \ldots, c_{N_{ldpc}-1}]=[i_0, i_1, i_2, \ldots, i_{K_{ldpc}-1}, p_0, p_1, p_2, \ldots, p_{N_{ldpc}-K_{ldpc}-1}]$. Here, $P=[p_0, p_1, p_2, \ldots, p_{N_{ldpc}-K_{ldpc}-1}]$ is a parity 104 and the number $N_{parity}$ of parity bits is as follows. $N_{parity}=N_{ldpc}-K_{ldpc}$.

The LDPC codes are a kind of linear block codes and include a process of determining a codeword satisfying conditions of following mathematical expression 1.

$$H \cdot c^T = [h_0, h_1, h_2, h_{N_{ldpc}-1}] \cdot c^T = \sum_{i=0}^{N_{ldpc}-1} c_i \cdot h_i = 0 \qquad (1),$$

where $c=[c_0, c_1, c_2, \ldots, c_{N_{ldpc}-1}]$.

In mathematical expression 1 above, H represents the parity-check matrix, C represents the codeword, $c_i$ represents an i-th bit of the codeword, and $N_{ldpc}$ represents a codeword length. Here, $h_1$ represents an i-th column of the parity-check matrix H.

The parity-check matrix H is formed of the same $N_{ldpc}$ columns as the number of bits of the LDPC codeword. The mathematical expression 1 represents that since a sum of a product of the i-th column $h_1$ of the parity-check matrix and the i-th bit $c_1$ of the codeword becomes "0", the i-th column $h_1$ has a relationship with the i-th bit $c_1$ of the codeword.

Meanwhile, the performance of the LDPC codes may be determined according to the parity-check matrix. Therefore, there is a need to design the parity-check matrix for the LDPC codes having improved performance.

SUMMARY

One or more exemplary embodiments may overcome the above disadvantages and other disadvantages not described above. However, these embodiments are not required to overcome the disadvantages described above and may not overcome any of the problems described above.

One or more exemplary embodiments provide a method and an apparatus for encoding and decoding LDPC codes capable of improving LDPC encoding and decoding performance.

According to an aspect of an exemplary embodiment, there is provided an encoding apparatus which may include: an LDPC encoder configured to perform LDPC encoding on input bits based on a first parity-check matrix or a second parity-check matrix to generate an LDPC codeword formed of 64,800 bits, wherein the parity-check matrix includes an information word sub-matrix and a parity sub-matrix, and the information word sub-matrix is formed of a plurality of column blocks each including 360 columns, and is defined by a table which represents positions of value one (1) presented in every 360-th column.

The LDPC encoder may perform the LDPC encoding using a parity-check matrix defined by a table like Table 17 when a code rate is 6/15.

The LDPC encoder may perform the LDPC encoding using a parity-check matrix defined by a table like Table 14 when the code rate is 8/15.

The LDPC encoder may perform the LDPC encoding using a parity-check matrix defined by a table like Table 18 when the code rate is 10/15.

The LDPC encoder may perform the LDPC encoding using a parity-check matrix defined by a table like Table 16 when the code rate is 12/15.

According to an aspect of another exemplary embodiment, there is provided an encoding method which may include: generating an LDPC codeword formed of 64,800 bits by performing LDPC encoding on input bits based on a parity-check matrix, in which the parity-check matrix includes an information word sub-matrix and a parity sub-matrix and the information word sub-matrix is formed of a plurality of column blocks each including 360 columns, and is defined by a table which represents positions of value one (1) presented in every 360-th column.

In the generating the LDPC codeword, the LDPC encoding may be performed using a parity-check matrix defined by a table like Table 17 when a code rate is 6/15.

In the generating of the LDPC codeword, the LDPC encoding may be performed using a parity-check matrix defined by a table like Table 14 when the code rate is 8/15.

In the generating the LDPC codeword, the LDPC encoding may be performed using a parity-check matrix defined by a table like Table 18 when the code rate is 10/15.

In the generating the LDPC codeword, the LDPC encoding may be performed using a parity-check matrix defined by a table like Table 16 when the code rate is 12/15.

According to an aspect of still another exemplary embodiment, there is provided a decoding apparatus which may include: an LDPC decoder configured to perform LDPC decoding on an LDPC codeword formed of 64,800 bits based on a parity-check matrix, wherein the parity-check matrix includes an information word sub-matrix and a parity sub-matrix, and the information word sub-matrix is formed of a plurality of column blocks each including 360 columns, and is defined by a table which represents positions of value one (1) presented in every 360-th column.

The LDPC decoder may perform the LDPC decoding using a parity-check matrix defined by a table like Table 17 when the code rate is 6/15.

The LDPC decoder may perform the LDPC decoding using a parity-check matrix defined by a table like Table 14 when the code rate is 8/15.

The LDPC decoder may perform the LDPC decoding using a parity-check matrix defined by a table like Table 18 when the code rate is 10/15.

The LDPC decoder may perform the LDPC decoding using a parity-check matrix defined by a table like Table 16 when the code rate is 12/15.

According to an aspect of still another exemplary embodiment, there is provided a decoding method which may include: performing LDPC decoding on an LDPC codeword formed of 64,800 bits based on a parity-check matrix, in which the parity-check matrix includes an information word sub-matrix and a parity sub-matrix and the information word sub-matrix is formed of a plurality of column blocks each including 360 columns, and is defined by a table which represents positions of value one (1) present in every 360-th column.

In the performing the LDPC decoding, the LDPC decoding may be performed using a parity-check matrix defined by a table like Table 17 when the code rate is 6/15.

In the performing the LDPC decoding, the LDPC decoding may be performed using a parity-check matrix defined by a table like Table 14 when the code rate is 8/15.

In the performing the LDPC decoding, the LDPC decoding may be performed using a parity-check matrix defined by a table like Table 18 when the code rate is 10/15.

In the performing the LDPC decoding, the LDPC decoding may be performed using a parity-check matrix defined by a table like Table 16 when the code rate is 12/15.

Additional and/or other aspects and advantages of the exemplary embodiments will be set forth in part in the description which follows and, in part, will be obvious from the description, or may be learned by practice of these embodiments.

BRIEF DESCRIPTION OF THE DRAWING FIGURES

The above and/or other aspects will be more apparent by describing certain exemplary embodiments with reference to the accompanying drawings, in which.

DETAILED DESCRIPTION OF THE EXEMPLARY EMBODIMENTS

Hereinafter, exemplary embodiments will be described in detail with reference to the accompanying drawings. Further, in describing the exemplary embodiments, detailed descriptions of well-known functions or constructions will be omitted so as not to obscure the description with unnecessary detail.

Hereinafter, the exemplary embodiments will describe a technology of LDPC encoding and LDPC decoding in a communication/broadcasting system.

Hereinafter, the exemplary embodiments use terms and names which are defined in the Digital Video Broadcasting the Second Generation Terrestrial (DVB-T2) system which is one of the European digital broadcasting standards and North America digital broadcasting standard system, Advanced Television Systems Committee (ATSC) 3.0 which is being established as standard. However, the inventive concept is not limited to these terms and names, but may be similarly applied to other systems.

A graph representation method of LDPC codes will be described with reference to FIG. 2.

Figure 1:
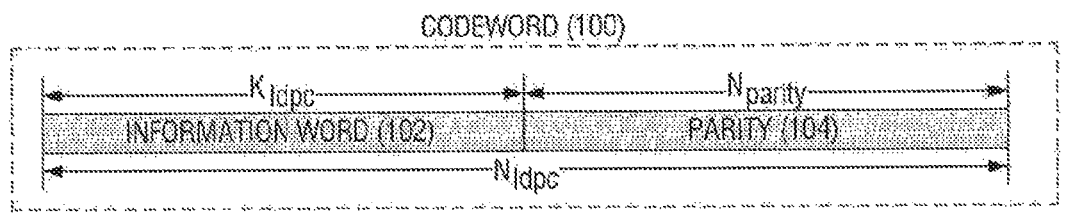
FIG. 1 is a diagram illustrating a codeword of a systematic LDPC code.
Figure 2:
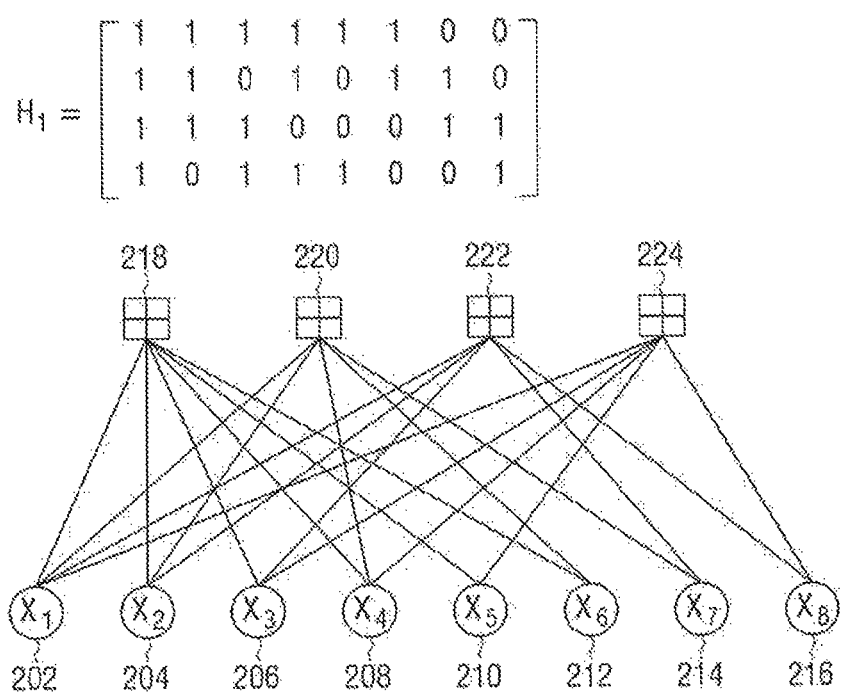
FIG. 2 is a diagram illustrating a parity-check matrix and a factor graph of general (8, 2, 4) LDPC codes.

FIG. 2 is a diagram illustrating an example of a parity-check matrix $H_1$ of the LDPC codes which is formed of four (4) rows and eight (8) columns. The parity-check matrix $H_1$ is represented with a tanner graph. Referring to FIG. 2, the parity-check matrix $H_1$ has eight (8) columns, and thus, a codeword having a length of eight (8) is generated. The Codes generated through the $H_1$ represent the LDPC codes, and each column of the $H_1$ corresponds to encoded eight (8) bits.

Referring to FIG. 2, the tanner graph of the LDPC codes which are encoded and decoded based on the parity-check matrix $H_1$ is formed of eight (8) variable nodes, that is, $x_1$ 202, $x_2$ 204, $x_3$ 206, $x_4$ 208, $x_5$ 210, $x_6$ 212, $x_7$ 214 and $x_8$ 216 and four check nodes 218, 220, 222 and 224. Here, an i-th column and a j-th row of the parity-check matrix $H_1$ of the LDPC codes each correspond to a variable node $x_i$ and a j-th check node, respectively. Further, a value of one (1) at an intersection point of a j-th column and a j-th row of the parity-check matrix $H_1$ of the LDPC codes, that is, a non-zero value represents that an edge connecting between the variable node $x_i$ and the j-th check node on the tanner graph as illustrated in FIG. 2 exists.

A degree of the variable node and the check node on the tanner graph of the LDPC codes represents the number of edges connected to each node, which is the same as the number of non-zero entries in a row or a column corresponding to the corresponding node in the parity-check matrix of the LDPC codes. For example, in FIG. 2, the degrees of the variable nodes $x_1$ 202, $x_2$ 204, $x_3$ 206, $x_4$ 208, $x_5$ 210, $x_6$ 212, $x_7$ 214 and $x_8$ 216 each become 4, 3, 3, 3, 2, 2, 2 and 2 in order, and the degrees of the check nodes 218, 220, 222 and 224 each become 6, 5, 5 and 5 in order. Further, the number of non-zero entries in each column of the parity-check matrix $H_1$ of FIG. 2 corresponding to the variable nodes of FIG. 2 coincides with the degrees 4, 3, 3, 3, 2, 2, 2 and 2 in order, and in each row of the parity-check matrix $H_1$ of FIG. 2 corresponding to the check nodes of FIG. 2, the number of non-zero entries coincides with the degrees 6, 5, 5 and 5 in order.

The LDPC codes may be decoded using an iterative decoding algorithm based on a sum-product algorithm on a bipartite graph illustrated in FIG. 2. Herein, the sum-product algorithm is a kind of message passing algorithm, and the message passing algorithm represents an algorithm which exchanges messages through the edge on the bipartite graph and calculates output messages using messages input to the variable nodes or the check nodes to update the messages.

Herein, a value of an i-th encoding bit may be determined based on a message of an i-th variable node. A soft decision and a hard decision may be performed on the value of the i-th encoding bit. Therefore, performance of an i-th bit $c_i$ of the LDPC codeword corresponds to performance of the i-th variable node, which may be determined depending on positions and the number of ones (1s) in the i-th column of the parity-check matrix. That is, performance of $N_{ldpc}$ bits of the codeword relies on the positions and number of ones (1s) in the parity-check matrix.

Hereinafter, characteristics of the parity-check matrix of the LDPC codes having a specific structure will be described with reference to FIG. 3.

Figure 3:
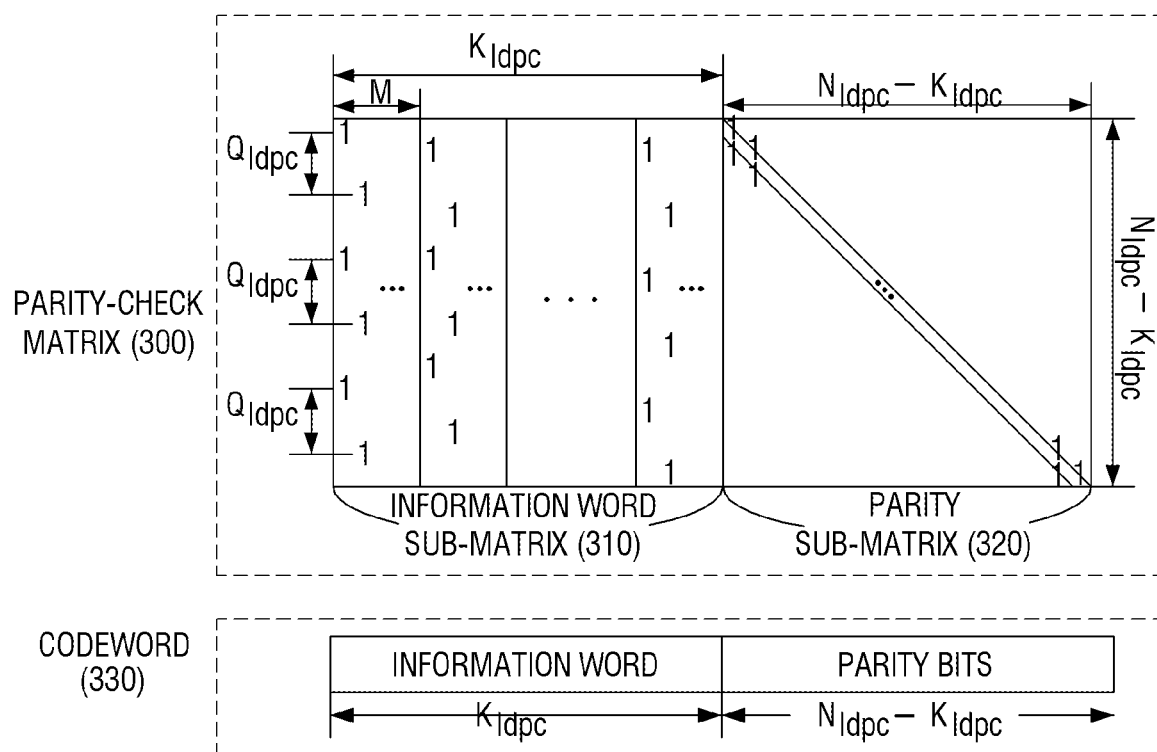
FIG. 3 is a diagram illustrating a parity-check matrix according to an exemplary embodiment.

FIG. 3 illustrates a parity-check matrix having a structure according to an exemplary embodiment. The parity-check matrix illustrated in FIG. 3 has a structure which may encode and decode a systematic code in which the codeword includes an original information word. Hereinafter, according to an exemplary embodiment will be described based on the parity-check matrix of FIG. 3, but a scope of application of the inventive concept is not limited to the parity-check matrix as illustrated in FIG. 3.

In FIG. 3, $N_{ldpc}$ represents the LDPC codeword length and $K_{ldpc}$ represents the information word length. Meanwhile, the codeword length or the information word length represents the number of bits included in the codeword or the information word, respectively. M represents an interval at which a pattern of a column is repeated in a sub-matrix (hereinafter, referred to as an information word sub-matrix) corresponding to the information word and $Q_{ldpc}$ is a size of cyclic shift of each column in the information word sub-matrix 310, in which values of the integer M and the $Q_{ldpc}$ are determined to be $Q_{ldpc}=(N_{ldpc}-K_{ldpc})/M$. Here, $K_{ldpc}/M$ is also an integer. Values of the M and the $Q_{ldpc}$ may be changed depending on the codeword length and a code rate (or coding rate).

Referring to FIG. 3, the parity-check matrix 300 is divided into the information word sub-matrix 310 (or information word matrix) corresponding to the information word and a parity sub-matrix 320 (or parity matrix) corresponding to the parity. The information word sub-matrix 310 includes $K_{ldpc}$ columns and the parity sub-matrix 320 includes $N_{parity}=N_{ldpc}-K_{ldpc}$ columns. The number of rows of the parity-check matrix 300 and the number of columns of the parity sub-matrix 320 are equal to $N_{ldpc}-K_{ldpc}$.

Positions of entries having weight-1s, that is, value one (1) present in the parity sub-matrix 320 including a $K_{ldpc}$-th column to an $(N_{ldpc}-1)$-th column of the parity-check matrix 300 have a dual diagonal structure. Therefore, among the columns included in the parity sub-matrix 320, all the degrees (herein, the degree is the number of ones (1s) included in each column) of the remaining columns except the $(N_{ldpc}-1)$-th column are two (2) and the degree of the $(N_{ldpc}-1)$-th column is one (1).

Meanwhile, a structure of the information word sub-matrix 310, that is, the sub-matrix including a zero (0)-th column to a $(K_{ldpc}-1)$-th column depends on the following rule.

First, the $K_{ldpc}$ columns corresponding to the information word in the parity-check matrix 300 belong to a plurality of column groups each having M columns, and the information word sub-matrix 310 is divided into a total of $K_{ldpc}/M$ column groups. In columns belonging to the same column group, positions of rows at which one (1) is present have a relationship in which a row having a value of one (1) is shifted by $Q_{ldpc}$ from an immediately previous row having the same value of one (1). Here, $Q_{ldpc}$ may be an integer greater than or equal to one (1).

Second, if it is assumed that a degree of a zero (0)-th column of an i-th (i=0, 1, . . . , $K_{ldpc}/M-1$) column group is $D_i$ and positions of each row at which one (1) is positioned are $R_{i,0}^{(0)}, R_{i,0}^{(1)}, \ldots, R_0^{(D_i-1)}$, an index $R_{i,j}^{(k)}$ of a row at which a k-th weight-1, i.e., k-th one (1), is positioned in a j-th column of the i-th column group is determined as represented by following mathematical expression 2.

$$R_{i,j}^{(k)}=(R_{i,(j-1)}^{(k)}+Q_{ldpc}) \bmod (N_{ldpc}-K_{ldpc}) \qquad (2)$$

In mathematical expression 2 above, k=0, 1, 2, . . . , $D_i-1$, i=0, 1, . . . , $K_{ldpc}/M-1$, and j=1, 2, . . . , M−1.

The above mathematical expression 2 may be represented like following mathematical expression 3.

$$R_{i,j}^{(k)} = (R_{i,0}^{(k)} + (j \bmod M) \times Q_{ldpc}) \bmod (N_{ldpc} - K_{ldpc}) \quad (3)$$

In mathematical expression 3 above, k=0, 1, 2, . . . , $D_i$−1, i=0, 1, . . . , $K_{ldpc}$/M−1, and j=1, 2, . . . , M−1.

In the above mathematical expressions, $R_{i,j}^{(k)}$ represent the indices of the row at which the k-th weight−1 is positioned in the j-th column of the i-th column group, $N_{ldpc}$ represents the LDPC codeword length, $K_{ldpc}$ represents the information word length, $D_i$ represents the degree of a zero (0)-th column belonging to the i-th column group, and M represents the number of columns belonging to one column group.

According to the above mathematical expressions, when only a value of $R_{i,0}^{(k)}$ is known, the indices of the row at which the k-th weight−1 is positioned in the i-th column group may be known. Therefore, when index values of the row at which the k-th weight−1 is positioned in the zero (0)-th column of each column group are stored, the positions of the column and the row at which the weight−1 is positioned may be understood in the parity-check matrix 300 (that is, the information word sub-matrix 310 of the parity-check matrix 300) having the structure illustrated in FIG. 3.

According to the above-mentioned rules, all of the degrees of the columns belonging to the i-th column group are Di. According to the above-mentioned rules, the LDPC codes in which information on the parity-check matrix 300 is stored may be simply represented as follows.

As a specific example, when $N_{ldpc}$ is 30, $K_{ldpc}$ is 15, and $Q_{ldpc}$ is three (3), position information of rows at which the weight−1 is positioned in zero (0)-th columns of three column groups may be represented by sequences as represented by following mathematical expression 4. The sequences represented by mathematical expression 4 may be called a weight−1 position sequence.

$$R_{1,0}^{(1)}=1, R_{1,0}^{(2)}=2, R_{1,0}^{(3)}=8, R_{1,0}^{(4)}=10$$

$$R_{2,0}^{(1)}=0, R_{2,0}^{(2)}=9, R_{2,0}^{(3)}=13$$

$$R_{3,0}^{(1)}=0, R_{3,0}^{(2)}=14 \quad (4)$$

In mathematical expression 4 above, $R_{i,j}^{(k)}$ represents the indices of the row at which the k-th weight−1 is positioned in the j-th column of the i-th column group.

The weight−1 position sequences as represented by the above mathematical expression 4, which represents the indices of the rows at which one (1) is positioned in the zero (0)-th column of each column group, may be more simply represented like following Table 1.

TABLE 1

| |
| --- |
| 1 2 8 10 |
| 0 9 13 |
| 0 14 |

Table 1 above shows the positions of entries having the weight−1, that is, value one (1) in the parity-check matrix, in which an i-th weight−1 position sequence is represented by the indices of the row at which the weight−1 is positioned in the zero (0)-th column belonging to the i-th column group.

Figure 4:
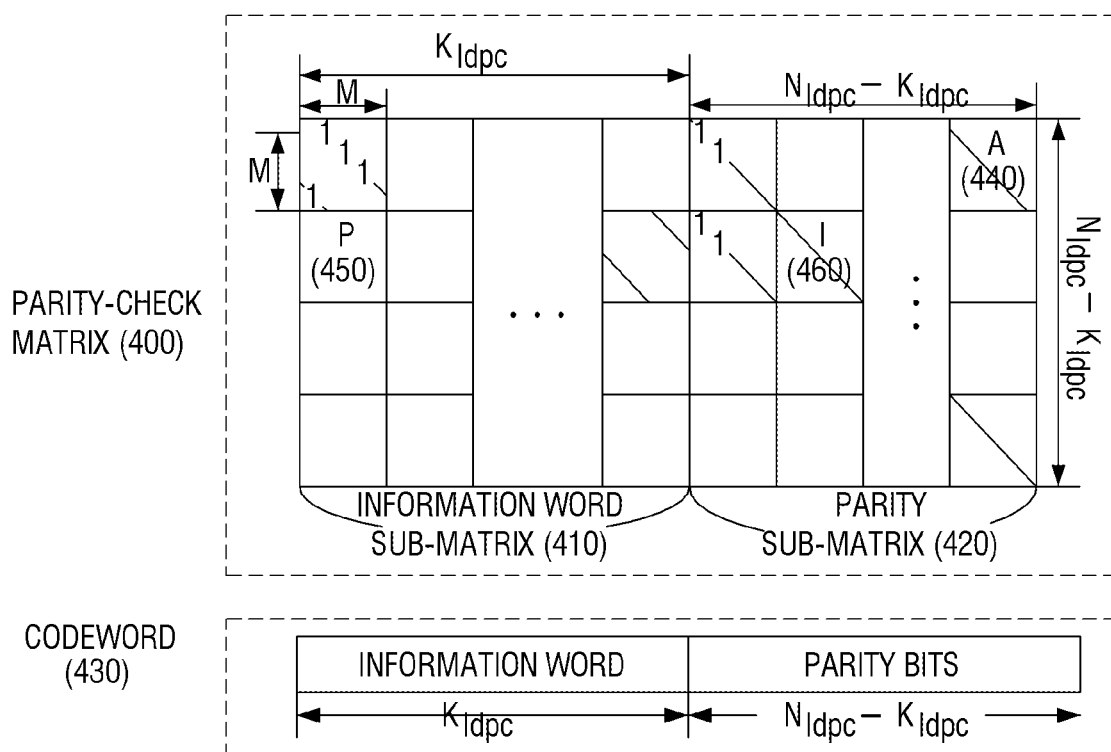
FIG. 4 is a diagram illustrating the parity-check matrix generated by permuting a row and a column of the parity-check matrix of FIG. 3, according to an exemplary embodiment.

When the column and the row of the parity-check matrix 300 illustrated in FIG. 3 are permuted by following mathematical expression 5 (row permutation) and mathematical expression 6 (column permutation), the parity-check matrix 300 illustrated in FIG. 3 may be shown as a form of a parity-check matrix 400 illustrated in FIG. 4.

$$Q_{ldpc} \times i + j \Rightarrow M \times j + i \quad (0 \le i < M, 0 \le j < Q_{ldpc}) \quad (5)$$

$$i \Rightarrow i \quad (0 \le i < K_{ldpc})$$

$$K_{ldpc} + Q_{ldpc} \times k + l \Rightarrow K_{ldpc} + M \times l + k \quad (0 \le k < M, 0 \le l < Q_{ldpc}) \quad (6)$$

In the above, the row permutation represents that an order of the rows of the parity-check matrix 300 is changed using mathematical expression 5 above. Further, the column permutation represents that an order of columns of the parity-check matrix 300 is changed using mathematical expression 6 above.

A method of performing permutation based on mathematical expressions 5 and 6 above is as follows. In this case, the column permutation is applied with the same principle as the row permutation, except the fact that the column permutation is applied only to the parity sub-matrix 320 by i⇒i ($0 \le i < K_{ldpc}$). Hereinafter, the row permutation will be described as an example.

In the case of the row permutation, i and j meeting $X = Q_{ldpc} \times i + j$ for an X-th row are calculated, and the calculated i and j are substituted in M×j+i to calculate a row in which the X-th row is permuted. For example, in the case of a seventh row, i and j meeting 7=2×i+j each are 3 and 1 and therefore the seventh row is permuted to a thirteenth (10×1+3=13) row.

When the row and column of the parity-check matrix of FIG. 3 are each permuted depending on the mathematical expressions 5 and 6, the parity-check matrix may be shown in a form of the parity-check matrix illustrated in FIG. 4.

Referring to FIG. 4, the parity-check matrix 400 of the LDPC codes has a form in which the entire parity-check matrix 400 is divided into a plurality of partial blocks and each of the partial blocks corresponds to an M×M quasi-cyclic matrix.

The parity-check matrix 400 illustrated in FIG. 4 is formed in a unit of the M×M quasi-cyclic matrix, and thus, M columns may be called a column-block (or column group) and M rows may be called a row-block (or row group). That is, the parity-check matrix 400 having the form of FIG. 4 which is used in the present exemplary embodiment is formed of $N_{qc\_column} = N_{ldpc}/M$ column-blocks and $N_{qc\_row} = N_{parity}/M$ row-blocks.

Hereinafter, M×M matrices forming the parity-check matrix 400 having the form of FIG. 4 will be described in detail.

First, an M×M matrix 440 of an ($N_{qc\_column}$−1)-th column-block among the zero (0)-th row-blocks has a form as represented by following mathematical expression 7.

$$A = \begin{bmatrix} 0 & 0 & \cdots & 0 & 0 \\ 1 & 0 & \cdots & 0 & 0 \\ 0 & 1 & \cdots & 0 & 0 \\ \vdots & \vdots & \vdots & \vdots & \vdots \\ 0 & 0 & \cdots & 1 & 0 \end{bmatrix} \quad (7)$$

In the M×M matrix as represented by mathematical expression 7 above, all the values of the zero (0)-th row and an M−1-th column are '0'. For $0 \le i \le (M-2)$, an (i+1)-th row of the i-th column is '1' and all the other values are '0'.

Second, in the parity sub-matrix 420 of the parity-check matrix 400 of FIG. 4, for $0 \le i \le (N_{ldpc} - K_{ldpc})/M - 1$, an i-th row-block of an ($K_{ldpc}/M+i$)-th column-blocks is formed of unit matrices $I_{M \times M}$ 460. Further, for $0 \le i \le (N_{ldpc} - K_{ldpc})/M - 2$, an (i+1)-th row block of the $K_{ldpc}/M+i$-th column-blocks is formed of the unit matrices $I_{M \times M}$ 460.

Third, the information word sub-matrix 410 may be a form in which a matrix $P^{a_{ij}}$ obtained by cyclically shifting a quasi-cyclic matrix P, or the quasi-cyclic matrix P and a matrix $P^{a_{ij}}$ obtained by cyclically shifting the quasi-cyclic matrix P are combined.

The quasi-cyclic matrix P is represented by following mathematical expression 8.

$$P = \begin{bmatrix} 0 & 1 & 0 & & 0 \\ 0 & 0 & 1 & \ldots & 0 \\ \vdots & \vdots & \vdots & & \vdots \\ 0 & 0 & 0 & \ldots & 1 \\ 1 & 0 & 0 & & 0 \end{bmatrix} \quad (8)$$

The quasi-cyclic matrix P of the above mathematical expression 8 is a square matrix having an M×M size and is a matrix of which the respective degrees of M rows and columns forming the quasi-cyclic matrix P are one (1).

If a subscript $a_{ij}$ of the quasi-cyclic matrix P is 0, the quasi-cyclic matrix $P^0$ represents a unit matrix $I_{M \times M}$, and if the subscript $a_{ij}$ of the quasi-cyclic matrix P is ∞, the quasi-cyclic matrix $P^{\infty}$ represents a zero matrix. As illustrated in FIG. 4, in the entire parity-check matrix of the LDPC codes, the total number of columns is $N_{ldpc}$=M× $N_{qc\_column}$ and the total number of rows is $N_{parity}$=M× $N_{qc\_row}$. That is, the parity-check matrix 400 as illustrated in FIG. 4 is formed of $N_{qc\_column}$ column-blocks and $N_{qc\_row}$ row-blocks.

The parity-check matrix 400 as illustrated in FIG. 4 is represented by positions of a non-zero quasi-cycle matrix and index values at the corresponding positions.

In the case of the LDPC codes, the codeword performance is determined according to the parity-check matrix. Specifically, the codeword performance may be determined according to a weight distribution and a cycle distribution of columns and rows.

The weight distribution of columns represents how many columns have one (1) and how many ones (1s) are positioned in the columns, in the $N_{ldpc}$ columns. Further, the weight distribution of rows represents how many rows have one (1) and how many ones (1s) are positioned in the rows, in the $N_{ldpc}$–$K_{ldpc}$ rows. Further, a weight or a degree of one (1) represents the number of ones (1s) of each column and row.

Herein, the weight distribution of columns and rows may be determined based on a method called density evolution (reference: Richardson, T., and URBANKE, R.: 'The capacity of low-density parity-check codes under message-passing decoding', IEEE Trans. Inf. Theory, 2001, 47, (2), pp. 599-618).

In detail, in the case of using the density evolution method, when the LDPC encoding/decoding are performed based on the parity-check matrix having the given degree distribution, it may be estimated how many times of iteration is required for coding error probability to be '0' at any signal to noise ratio (SNR). In the case of the density evolution, since it is estimated whether the coding error probability is '0' under the assumption that the codeword length is infinite, the degree distribution of the parity-check matrix may not be determined only by the density evolution if the parity-check matrix for codes having a finite length is designed.

Further, the number of ones (1s) depending on the degree distribution of the parity-check matrix affects encoding/decoding complexity, and thus, the parity-check matrix needs to be designed based on the code performance which is verified not only based on a theoretical approach called the density evolution but also on the actual encoding/decoding complexity and the deigned parity-check matrix.

Hereinafter, a method for designing a parity-check matrix will be described in detail.

The form of a parity-check matrix may be very variously present, but the inventive concept intends to design a parity-check matrix having a specific form illustrated in FIG. 3. Further, a parity-check matrix determines the degree distribution, in which a coding gain may be maximal, based on the density evolution, and by a cycle removing method, an error floor occurs in an area in which BER/FER is low. As described above, the parity-check matrix 300 having the form of FIG. 3 turns into the parity-check matrix 400 having the form of FIG. 4 by permuting the columns and the rows. In the case of the form of FIG. 4, the parity-check matrix may is designed based on the M×M matrix, and thus, may be easily designed. Therefore, according to an exemplary embodiment, a parity-check matrix is designed in the form of the parity-check matrix 400 having the form of FIG. 4, and then, the parity-check matrix 300 having the form of FIG. 3 is designed by permuting the rows and the columns.

Hereinafter, the method for designing a parity-check matrix according to an exemplary embodiment will be described in detail.

Step 1) The sizes $N_{ldpc}$ and $K_{ldpc}$ and the values of M and $Q_{ldpc}$ of the parity-check matrix to be designed are determined.

According to an exemplary embodiment, the foregoing parameters of the parity-check matrix may be determined as following Table 2.

TABLE 2

| code rate | $N_{ldpc}$ | $K_{ldpc}$ | $N_{parity}$ | M | $Q_{ldpc}$ | $N_{qc\_column}$ | $N_{qc\_row}$ |
|---|---|---|---|---|---|---|---|
| 6/15 | 64800 | 25920 | 38880 | 360 | 108 | 180 | 108 |
| 8/15 | 64800 | 34560 | 30240 | 360 | 84 | 180 | 84 |
| 10/15 | 64800 | 43200 | 21600 | 360 | 60 | 180 | 60 |
| 12/15 | 64800 | 51840 | 12960 | 360 | 36 | 180 | 36 |

In the case of the parity-check matrix 400 having the form of FIG. 4, a parity sub-matrix 420 is fixed, and thus, only the positions and distributions of one (1) in the information word sub-matrix 410 need to be determined. Further, the positions and distributions of one (1) in the information word sub-matrix 410 are formed in a unit of M×M quasi-cyclic matrix, and thus, the number and positions of quasi-cyclic matrix, which is not a zero matrix, and cyclic shift values which are the index values of the quasi-cyclic matrices are determined.

Hereinafter, in step 2, the number of quasi-cyclic matrix, not the zero matrix, is determined.

Step 2) The degree distribution of the parity-check matrix is determined by the density evolution method.

As described above, the distribution of one (1) in the parity-check matrix dominates the performance of the LDPC codes. Therefore, according to an exemplary embodiment, the distribution of one (1) in the parity-check matrix is determined by the density evolution method. That is, a degree distribution having the highest probability for error probability to converge to a predetermined value by performing iterative decoding as many as a predetermined times, that is, a degree distribution having the lowest SNR is selected from all the possible degree distributions.

In this case, restrictions are as follows.

1) The number of ones (is) in an LDPC code affects the encoding and decoding complexity, and thus, the number of ones (is) needs to be limited.

2) If the number of ones (1s) present in a column is various, the decoding complexity may be increased, and thus, a kind of the number of ones (1s) needs to be limited.

First, all the possible degree distributions (lists) are determined based on the parity-check matrix having parameters of the above Table 2 in consideration of the foregoing restrictions. Next, after a target SNR for each code rate is determined, when the LDPC codes encoded/decoded based on the parity-check matrix having the degree distributions present in the list at the target SNR by the density evolution are decoded, it is determined how many time of iteration is required for the error probability to converge to a predetermined value.

In this case, for all the degree distributions present in the list, when the error probability is converged to a predetermined value or less within the number of iteration times smaller than a specific value, the target SNR value is adjusted to be small and the density evolution for the degree distribution is performed again.

However, when the result value of the density evolution for all the degree distribution is not converged even within more iterations than the specific value, the SNR value is adjusted to be large and the density evolution for the degree distribution is performed again.

Among all the degree distributions present in the list, the degree distribution in which the error probability is converged to the predetermined value or less within the low SNR and the small iterative decoding (that is, iteration number of times) is determined as the result of step 1.

Step 3) The position of the non-zero quasi-cyclic matrix is determined based on the degree distribution determined in step 2.

In this step, the position of the non-zero quasi-cyclic matrix is determined based on a well known PEG algorithm (X.-Y. Hu, E. Eleftheriou, and D.-M. Arnold, "Regular and irregular progressive edge-growth tanner graphs", IEEE Trans. Inf. Theory, vol. 51, no. 1, pp. 386-398, January 2005.) In this case, additional restrictions suggested by the present invention are to make the number of 1s in each row maximally uniform.

Step 4) The indices of the quasi-cycle matrices need to be adjusted so as to prevent the error floor from occurring.

In this step, the parity sub-matrix is fixed, and thus, is not considered. In the information word sub-matrix, only the index values of non-zero quasi-cycle matrices positioned in a predetermined row need to be changed from a column having the lowest column degree.

In this step, all index values of the non-zero quasi-cycle matrices, except the parity sub-matrix 420, positioned in the same row need to have different values.

The order of the rows at which the index values are changed may be various. A change in the index values is repeated until a cycle value of a minimum cycle is no more increased or the number of variable nodes having the minimum cycle is no more improved. Here, step 4 is called lifting.

Step 5) The parity-check matrix designed based on FIG. 4 needs to be modified into the form of FIG. 3 by the row permutation and the column permutation.

In this case, the row permutation may be performed based on following mathematical expression 9 and the column permutation may be performed based on following mathematical expression 10.

$$M \times i+j \Rightarrow Q_{ldpc} \times j+i \quad (0 \leq i < Q_{ldpc}, 0 \leq j < M) \tag{9}$$

$$i \Rightarrow i \quad (0 \leq i < K_{ldpc})$$

$$K_{ldpc}+M \times k+l \Rightarrow K_{ldpc}+Q_{ldpc} \times 1+k \quad (0 \leq k < Q_{ldpc}, 0 \leq l < M) \tag{10}$$

Hereinafter, a process of designing a parity-check matrix will be described in more detail with reference to a case of a code rate 10/15 (=2/3) as an example.

Step 1) Parameters $N_{ldpc}$ and $K_{ldpc}$ related to the size and the values of M and $Q_{ldpc}$ of the parity-check matrix to be designed are determined as following Table 3.

TABLE 3

| code rate | $N_{ldpc}$ | $K_{ldpc}$ | $N_{parity}$ | M | $Q_{ldpc}$ | $N_{qc\_column}$ | $N_{qc\_row}$ |
|---|---|---|---|---|---|---|---|
| 10/15 | 64800 | 43200 | 21600 | 360 | 60 | 180 | 60 |

Step 2) The degree distribution of the parity-check matrix is determined based on the density evolution method.

The distributions in which the error probability is highly likely to be a predetermined value at the lowest SNR as a result of the density evolution are selected from all the possible degree distributions. For example, for the selected distributions, when SNR=2.6 dB, the iteration number of times to make BER=$10^{-5}$ is obtained by the density evolution method. The selected distributions and the iteration number of times obtained based on the density evolution for the selected distributions are as shown in following Table 4. In following Table 4, N ($x_i$) represents the number of column groups or column blocks having a degree of $x_i$.

TABLE 4

| case | Degree ($x_1$) | N($x_1$) | Degree ($x_2$) | N($x_2$) | Degree ($x_3$) | N($x_3$) | Degree ($x_4$) | N($x_4$) | The number of iterations meeting BER = $10^{-5}$ |
|---|---|---|---|---|---|---|---|---|---|
| 1 | 16 | 23 | 4 | 2 | 3 | 95 | 2 | 60 | 65 |
| 2 | 16 | 23 | 4 | 13 | 3 | 84 | 2 | 60 | 65 |
| 3 | 17 | 20 | 4 | 31 | 3 | 69 | 2 | 60 | 73 |
| 4 | 17 | 19 | 4 | 42 | 3 | 59 | 2 | 60 | 94 |
| 5 | 15 | 26 | 4 | 0 | 3 | 94 | 2 | 60 | 63 |
| 6 | 16 | 24 | 4 | 0 | 3 | 96 | 2 | 60 | 63 |

Step 3) The positions of the non-zero quasi-cyclic matrix is determined based on the degree distribution determined in step 2.

According to an exemplary embodiment, a degree distribution of case 6 of above Table 4 is selected. Further, to meet the selected degree distribution, positions of the non-zero quasi-cycle matrix is determined.

The reason of determining case 6 is that, as described above, the number of ones (1s) depending on the degree distribution of the parity-check matrix affects encoding/decoding complexity, and thus, the parity-check matrix needs to be designed based on the code performance which is not only based on a theoretical approach called the density evolution but also on the actual encoding/decoding complexity and the deigned parity-check matrix.

Step 4) The indices of the quasi-cycle matrices need to be adjusted so as to prevent the error floor from occurring.

Following Table 5 shows positions and index values of the quasi-cycle matrices of the parity-check matrix 400 having the form of FIG. 4 which is determined by the foregoing method. In this process, the method called the lifting (see foregoing step 4) considering the cycle characteristics is used.

TABLE 5

| | Indices of column groups in which non-zero quasi-cycle matrix of i-th row is positioned | Indices of non-zero quasi-cycle matrix of i-th row |
|---|---|---|
| 0 | 3 6 12 14 15 23 34 61 81 87 108 120 179 | 350 122 72 90 310 344 85 245 10 12 93 0 359 |
| 1 | 1 4 9 10 13 19 38 49 79 83 106 120 121 | 313 156 2 258 227 245 5 117 280 96 211 0 0 |
| 2 | 3 5 15 20 22 23 44 62 78 91 99 121 122 | 219 33 282 344 118 250 5 238 352 230 120 0 0 |
| 3 | 0 8 12 16 21 23 28 56 93 98 117 122 123 | 211 302 339 64 228 247 147 13 38 143 247 0 0 |
| 4 | 1 7 8 9 16 19 20 46 55 64 101 123 124 | 104 289 301 304 55 48 170 244 39 185 268 0 0 |
| 5 | 2 3 12 13 18 20 24 54 80 112 114 124 125 | 5 355 305 99 306 88 96 288 22 52 124 0 0 |
| 6 | 1 6 8 14 16 17 34 40 74 102 107 125 126 | 309 348 241 98 41 83 3 143 140 102 227 0 0 |
| 7 | 4 8 10 12 19 20 35 37 48 75 103 126 127 | 108 341 333 17 211 187 104 239 140 284 137 0 0 |
| 8 | 0 4 14 17 21 23 33 65 78 82 98 127 128 | 38 165 219 233 270 282 63 281 264 225 209 0 0 |
| 9 | 5 6 13 18 19 21 22 41 67 76 109 128 129 | 8 207 200 148 234 33 307 100 203 162 94 0 0 |
| 10 | 1 2 3 5 11 13 14 29 60 91 103 112 129 130 | 271 291 274 212 110 57 80 180 134 208 244 337 0 0 |
| 11 | 6 7 8 11 15 21 23 38 58 72 74 130 131 | 253 35 207 278 180 122 120 75 147 0 174 0 0 |
| 12 | 4 11 19 20 21 22 25 47 80 111 115 131 132 | 124 95 102 48 172 177 244 144 83 207 136 0 0 |
| 13 | 3 5 7 14 15 17 18 37 69 83 84 110 132 133 | 66 211 233 54 315 342 338 208 229 357 199 143 0 0 |
| 14 | 1 4 7 10 14 15 17 20 28 52 77 88 133 134 | 43 282 309 252 263 115 220 85 139 214 114 302 0 0 |
| 15 | 0 4 5 6 8 18 39 43 71 79 104 134 135 | 283 20 166 310 147 229 316 359 268 15 194 0 0 |
| 16 | 1 4 5 18 21 22 40 60 84 97 118 135 136 | 151 213 230 83 304 132 47 336 276 233 167 0 0 |
| 17 | 0 6 9 14 21 22 23 27 59 75 110 136 137 | 70 23 169 174 230 15 19 119 25 57 40 0 0 |
| 18 | 1 4 11 18 21 23 31 66 73 77 91 137 138 | 78 222 317 343 322 29 293 15 97 268 17 0 0 |
| 19 | 3 8 12 17 18 22 47 65 90 102 117 138 139 | 1 173 0 282 148 282 299 122 42 212 311 0 0 |
| 20 | 0 2 11 13 15 22 24 42 49 75 88 139 140 | 8 186 278 1 309 186 57 294 255 293 67 0 0 |
| 21 | 0 5 7 9 12 16 17 45 51 84 108 117 140 141 | 141 342 45 270 83 272 333 19 105 153 314 134 0 0 |
| 22 | 2 5 10 11 15 17 33 43 59 72 87 141 142 | 280 99 183 227 276 301 288 45 156 17 334 0 0 |
| 23 | 6 7 8 10 13 17 19 25 56 94 103 114 142 143 | 248 36 200 344 99 188 1 86 341 163 249 259 0 0 |
| 24 | 4 11 13 17 19 22 40 70 88 100 113 143 144 | 214 302 90 221 3 359 263 295 49 77 260 0 0 |
| 25 | 2 7 12 15 16 17 32 54 68 99 104 144 145 | 127 298 45 313 172 44 310 122 188 23 298 0 0 |
| 26 | 3 7 14 16 20 22 38 48 85 98 100 145 146 | 210 76 196 27 126 248 72 87 62 138 171 0 0 |
| 27 | 5 9 10 20 21 23 27 52 67 90 94 146 147 | 215 238 252 154 354 147 254 222 258 37 1 0 0 |
| 28 | 2 3 4 7 13 14 16 42 58 82 95 97 147 148 | 2 13 13 154 102 123 242 290 126 13 73 198 0 0 |
| 29 | 0 2 9 10 18 21 29 55 69 89 102 148 149 | 192 26 268 101 49 133 152 33 161 310 219 0 0 |
| 30 | 1 3 8 9 10 17 20 43 63 76 100 149 150 | 225 53 256 42 50 265 344 15 72 65 324 0 0 |
| 31 | 0 2 7 9 21 22 32 47 61 92 116 150 151 | 251 329 4 144 203 135 90 137 242 215 71 0 0 |
| 32 | 3 8 12 15 16 19 23 35 64 73 106 151 152 | 75 9 53 305 219 76 316 278 264 41 194 0 0 |
| 33 | 0 1 5 6 8 9 12 36 52 72 105 112 152 153 | 193 289 122 345 268 45 252 142 42 244 261 216 0 0 |
| 34 | 2 3 6 11 13 14 30 53 83 109 119 153 154 | 198 238 102 316 125 311 215 304 171 233 25 0 0 |
| 35 | 0 5 7 17 19 23 24 63 78 96 118 154 155 | 325 212 281 345 46 101 151 172 236 138 51 0 0 |
| 36 | 2 5 9 10 12 15 19 26 56 66 71 107 155 156 | 55 12 237 99 228 150 213 104 91 291 92 131 0 0 |
| 37 | 1 4 6 18 22 23 29 51 61 85 96 156 157 | 210 300 236 46 341 2 333 314 107 60 342 0 0 |
| 38 | 2 8 11 14 16 18 19 39 54 73 82 119 157 158 | 110 225 136 154 222 159 50 273 159 62 240 76 0 0 |
| 39 | 2 9 13 15 16 20 23 36 49 86 101 158 159 | 125 324 179 352 157 311 41 213 260 215 224 0 0 |
| 40 | 1 3 6 12 18 19 31 57 92 95 114 159 160 | 99 265 202 210 13 265 100 118 275 280 100 0 0 |
| 41 | 0 4 7 9 13 20 41 50 64 74 96 160 161 | 266 328 333 343 93 305 316 282 57 341 293 0 0 |
| 42 | 4 14 15 19 20 28 32 86 89 110 161 162 | 74 103 45 205 151 222 156 106 358 170 294 0 0 |
| 43 | 3 10 11 16 18 21 22 45 53 58 111 162 163 | 148 60 91 137 330 224 338 144 128 65 284 0 0 |
| 44 | 2 10 11 12 13 14 15 34 57 67 68 115 163 164 | 21 77 206 51 84 9 316 125 322 96 210 4 0 0 |
| 45 | 0 1 9 10 13 20 26 59 80 106 113 164 165 | 310 173 346 83 239 206 327 198 262 64 280 0 0 |
| 46 | 2 5 7 8 15 16 19 41 44 70 85 105 165 166 | 250 147 233 254 87 92 243 266 13 222 227 290 0 0 |
| 47 | 1 4 6 12 22 23 39 53 55 94 116 166 167 | 110 124 212 137 199 102 123 186 133 280 231 0 0 |
| 48 | 0 7 10 12 16 21 22 48 66 87 97 167 168 | 133 207 254 348 289 340 189 35 113 273 9 0 0 |
| 49 | 4 5 10 11 16 23 30 51 62 90 101 168 169 | 290 18 27 182 317 248 4 19 294 206 311 0 0 |
| 50 | 3 5 14 18 19 22 25 57 89 105 119 169 170 | 304 298 256 329 99 110 263 181 249 340 13 0 0 |
| 51 | 1 8 9 13 14 16 18 42 71 81 109 170 171 | 102 90 110 343 80 310 19 327 250 173 93 0 0 |
| 52 | 0 10 11 13 16 20 35 44 86 108 115 171 172 | 269 356 84 303 323 200 351 49 287 307 200 0 0 |
| 53 | 2 11 17 21 22 23 31 63 93 104 113 172 173 | 74 127 272 61 163 349 261 183 125 99 117 0 0 |
| 54 | 0 5 6 9 11 13 45 46 65 70 81 173 174 | 359 30 277 163 179 218 178 286 85 286 327 0 0 |
| 55 | 2 6 8 17 20 23 26 37 62 76 95 174 175 | 280 8 87 185 136 193 300 25 261 340 120 0 0 |
| 56 | 3 6 8 10 19 21 36 50 60 93 116 175 176 | 72 89 240 39 250 214 225 22 176 88 291 0 0 |
| 57 | 4 6 7 9 11 12 15 33 68 69 107 176 177 | 73 65 150 80 133 233 273 228 4 232 6 0 0 |
| 58 | 0 3 7 14 15 17 18 27 46 79 92 118 177 178 | 124 39 149 116 100 145 240 290 57 304 105 13 0 0 |
| 59 | 1 12 17 18 20 21 30 50 77 99 111 178 179 | 317 35 148 6 341 32 347 14 326 342 237 0 0 |
| 60 | 3 6 12 14 15 23 34 61 81 87 108 120 179 | 350 122 72 90 310 344 85 245 10 12 93 0 359 |
| 61 | 1 4 9 10 13 19 38 49 79 83 106 120 121 | 313 156 2 258 227 245 5 117 280 96 211 0 0 |
| 62 | 3 5 15 20 22 23 44 62 78 91 99 121 122 | 219 33 282 344 118 250 5 238 352 230 120 0 0 |
| 63 | 0 8 12 16 21 23 28 56 93 98 117 122 123 | 211 302 339 64 228 247 147 13 38 143 247 0 0 |

TABLE 5-continued

| | Indices of column groups in which non-zero quasi-cycle matrix of i-th row is positioned | Indices of non-zero quasi-cycle matrix of i-th row |
|---|---|---|
| 64 | 1 7 8 9 16 19 20 46 55 64 101 123 124 | 104 289 301 304 55 48 170 244 39 185 268 0 0 |
| 65 | 2 3 12 13 18 20 24 54 80 112 114 124 125 | 5 355 305 99 306 88 96 288 22 52 124 0 0 |
| 66 | 1 6 8 14 16 17 34 40 74 102 107 125 126 | 309 348 241 98 41 83 3 143 140 102 227 0 0 |
| 67 | 4 8 10 12 19 20 35 37 48 75 103 126 127 | 108 341 333 17 211 187 104 239 140 284 137 0 0 |
| 68 | 0 4 14 17 21 23 33 65 78 82 98 127 128 | 38 165 219 233 270 282 63 281 264 225 209 0 0 |
| 69 | 5 6 13 18 19 21 22 41 67 76 109 128 129 | 8 207 200 148 234 33 307 100 203 162 94 0 0 |
| 70 | 1 2 3 5 11 13 14 29 60 91 103 112 129 130 | 271 291 274 212 110 57 80 180 134 208 244 337 0 0 |
| 71 | 6 7 8 11 15 21 23 38 58 72 74 130 131 | 253 35 207 278 180 122 120 75 147 0 174 0 0 |
| 72 | 4 11 19 20 21 22 25 47 80 111 115 131 132 | 124 95 102 48 172 177 244 144 83 207 136 0 0 |
| 73 | 3 5 7 14 15 17 18 37 69 83 84 110 132 133 | 66 211 233 54 315 342 338 208 229 357 199 143 0 0 |
| 74 | 1 4 7 10 14 15 17 20 28 52 77 88 133 134 | 43 282 309 252 263 115 220 85 139 214 114 302 0 0 |
| 75 | 0 4 5 6 8 18 39 43 71 79 104 134 135 | 283 20 166 310 147 229 316 359 268 15 194 0 0 |
| 76 | 1 4 5 18 21 22 40 60 84 97 118 135 136 | 151 213 230 83 304 132 47 336 276 233 167 0 0 |
| 77 | 0 6 9 14 21 22 23 27 59 75 110 136 137 | 70 23 169 174 230 15 19 119 25 57 40 0 0 |
| 78 | 1 4 11 18 21 23 31 66 73 77 91 137 138 | 78 222 317 343 322 29 293 15 97 268 17 0 0 |
| 79 | 3 8 12 17 18 22 47 65 90 102 117 138 139 | 1 173 0 282 148 282 299 122 42 212 311 0 0 |
| 80 | 0 2 11 13 15 22 24 42 49 75 88 139 140 | 8 186 278 1 309 186 57 294 255 293 67 0 0 |
| 81 | 0 5 7 9 12 16 17 45 51 84 108 117 140 141 | 141 342 45 270 83 272 333 19 105 153 314 134 0 0 |
| 82 | 2 5 10 11 15 17 33 43 59 72 87 141 142 | 280 99 183 227 276 301 288 45 156 17 334 0 0 |
| 83 | 6 7 8 10 13 17 19 25 56 94 103 114 142 143 | 248 36 200 344 99 188 1 86 341 163 249 259 0 0 |
| 84 | 4 11 13 17 19 22 40 70 88 100 113 143 144 | 214 302 90 221 3 359 263 295 49 77 260 0 0 |
| 85 | 2 7 12 15 16 17 32 54 68 99 104 144 145 | 127 298 45 313 172 44 310 122 188 23 298 0 0 |
| 86 | 3 7 14 16 20 22 38 48 85 98 100 145 146 | 210 76 196 27 126 248 72 87 62 138 171 0 0 |
| 87 | 5 9 10 20 21 23 27 52 67 90 94 146 147 | 215 238 252 154 354 147 254 222 258 37 1 0 0 |
| 88 | 2 3 4 7 13 14 16 42 58 82 95 97 147 148 | 2 13 13 154 102 123 242 290 126 13 73 198 0 0 |
| 89 | 0 2 9 10 18 21 29 55 69 89 102 148 149 | 192 26 268 101 49 133 152 33 161 310 219 0 0 |
| 90 | 1 3 8 9 10 17 20 43 63 76 100 149 150 | 225 53 256 42 50 265 344 15 72 65 324 0 0 |
| 91 | 0 2 7 9 21 22 32 47 61 92 116 150 151 | 251 329 4 144 203 135 90 137 242 215 71 0 0 |
| 92 | 3 8 12 15 16 19 23 35 64 73 106 151 152 | 75 9 53 305 219 76 316 278 264 41 194 0 0 |
| 93 | 0 1 5 6 8 9 12 36 52 72 105 112 152 153 | 193 289 122 345 268 45 252 142 42 244 261 216 0 0 |
| 94 | 2 3 6 11 13 14 30 53 83 109 119 153 154 | 198 238 102 316 125 311 215 304 171 233 25 0 0 |
| 95 | 0 5 7 17 19 23 24 63 78 96 118 154 155 | 325 212 281 345 46 101 151 172 236 138 51 0 0 |
| 96 | 2 5 9 10 12 15 19 26 56 66 71 107 155 156 | 55 12 237 99 228 150 213 104 91 291 92 131 0 0 |
| 97 | 1 4 6 18 22 23 29 51 61 85 96 156 157 | 210 300 236 46 341 2 333 314 107 60 342 0 0 |
| 98 | 2 8 11 14 16 18 19 39 54 73 82 119 157 158 | 110 225 136 154 222 159 50 273 159 62 240 76 0 0 |
| 99 | 2 9 13 15 16 20 23 36 49 86 101 158 159 | 125 324 179 352 157 311 41 213 260 215 224 0 0 |
| 100 | 1 3 6 12 18 19 31 57 92 95 114 159 160 | 99 265 202 210 13 265 100 118 275 280 100 0 0 |
| 101 | 0 4 7 9 13 20 41 50 64 74 96 160 161 | 266 328 333 343 93 305 316 282 57 341 293 0 0 |
| 102 | 1 4 14 15 19 20 28 32 86 89 110 161 162 | 74 103 45 205 151 222 156 106 358 170 294 0 0 |
| 103 | 3 10 11 16 18 21 22 45 53 58 111 162 163 | 148 60 91 137 330 224 338 144 128 65 284 0 0 |
| 104 | 2 10 11 12 13 14 15 34 57 67 68 115 163 164 | 21 77 206 51 84 9 316 125 322 96 210 4 0 0 |
| 105 | 0 1 9 10 13 20 26 59 80 106 113 164 165 | 310 173 346 83 239 206 327 198 262 64 280 0 0 |
| 106 | 2 5 7 8 15 16 19 41 44 70 85 105 165 166 | 250 147 233 254 87 92 243 266 13 222 227 290 0 0 |
| 107 | 1 4 6 12 22 23 39 53 55 94 116 166 167 | 110 124 212 137 199 102 123 186 133 280 231 0 0 |
| 108 | 0 7 10 12 16 21 22 48 66 87 97 167 168 | 133 207 254 348 289 340 189 35 113 273 9 0 0 |
| 109 | 4 5 10 11 16 23 30 51 62 90 101 168 169 | 290 18 27 182 317 248 4 19 294 206 311 0 0 |
| 110 | 3 5 14 18 19 22 25 57 89 105 119 169 170 | 304 298 256 329 99 110 263 181 249 340 13 0 0 |
| 111 | 1 8 9 13 14 16 18 42 71 81 109 170 171 | 102 90 110 343 80 310 19 327 250 173 93 0 0 |
| 112 | 0 10 11 13 16 20 35 44 86 108 115 171 172 | 269 356 84 303 323 200 351 49 287 307 200 0 0 |
| 113 | 2 11 17 21 22 23 31 63 93 104 113 172 173 | 74 127 272 61 163 349 261 183 125 99 117 0 0 |
| 114 | 0 5 6 9 11 13 45 46 65 70 81 173 174 | 359 30 277 163 179 218 178 286 85 286 327 0 0 |
| 115 | 2 6 8 17 20 23 26 37 62 76 95 174 175 | 280 8 87 185 136 193 300 25 261 340 120 0 0 |
| 116 | 3 6 8 10 19 21 36 50 60 93 116 175 176 | 72 89 240 39 250 214 225 22 176 88 291 0 0 |
| 117 | 4 6 7 9 11 12 15 33 68 69 107 176 177 | 73 65 150 80 133 233 273 228 4 232 6 0 0 |
| 118 | 0 3 7 14 15 17 18 27 46 79 92 118 177 178 | 124 39 149 116 100 145 240 290 57 304 105 13 0 0 |
| 119 | 1 12 17 18 20 21 30 50 77 99 111 178 179 | 317 35 148 6 341 32 347 14 326 342 237 0 0 |

Step 5) The parity-check matrix designed based on FIG. 4 in step 4 needs to be modified into the form of FIG. 3 by the row permutation and the column permutation.

Hereinafter, examples of the parity-check matrix designed by the foregoing method for designing a parity-check matrix will be described.

It is well known that any parity-check matrix $H_1$ is equivalent to a parity-check matrix $H_2$ obtained by performing row permutation and column permutation on the parity-check matrix $H_1$. That is, any parity-check matrix having the form of FIG. 3 is equivalent to a parity-check matrix having the form of FIG. 4 obtained by performing row permutation and column permutation on the parity-check matrix of FIG. 3.

Further, a parity-check matrix having the form of FIG. 3 and a parity-check matrix in which an order of column groups of the parity-check matrix of FIG. 3 according to the exemplary embodiment are also equivalent to each other.

Further, when index values of a row at which one (1) is positioned in a zero (0)-th column of an i-th column group are $k_1, k_2, \ldots, K_m$ (herein, m is a column degree of the i-th column group), parity-check matrices are equivalent to each other even when the index values of the row at which one (1) is positioned in the zero (0)-th column of the i-th column group are changed to $(K_x+Q_{ldpc} \times y) \bmod (N_{ldpc}-K_{ldpc})$ ($1 \le k \le m$). $Q_{ldpc}$ is $(N_{ldpc}-K_{ldpc})/M$ as described above, in which M represents the number of columns belonging to a column group. Further, y is any constant.

As a specific example, in the case in which $N_{ldpc}$ is 30, $K_{ldpc}$ is 15, and $Q_{ldpc}$ is 3, if a case in which position information about rows at which weight-1s are positioned in zero (0)-th columns of three column groups is represented as following Table 6,

TABLE 6

1 2 8 10
0 9 13
0 14

When y is 2, since 1→(1+3×2)mod 15=7

2→(2+3×2)mod 15=8

8→(8+3×2)mod 15=14

10→(10+3×2)mod 15=1

0→(0+3×2)mod 15=6

9→(9+3×2)mod 15=0

13→(13+3×2)mod 15=4

0→(0+3×2)mod 15=6

14→(14+3×2)mod 15=5, the parity-check matrices are equivalent to one another even when the position information about the row at which the weight-1s are positioned in the zero (0)-th columns of the three column groups is represented as following Table 7.

TABLE 7

7 8 14 1
6 0 4
6 5

Further, the parity-check matrices are equivalent to one another even when an order of the column groups is changed, and thus, the parity-check matrices represented as the following Table 8 are also equivalent to one another.

TABLE 8

0 9 3
0 14
1 2 8 10

Further, in the case of the parity-check matrix having the form of FIG. 4 according to the exemplary embodiment, when the index values of the quasi-cycle matrix present in the same column group or column block are added or subtracted to or from the same value, the parity-check matrix may be equal to the previous parity-check matrix. Further, the parity-check matrices in which an order of the column-blocks is changed are equivalent to one another.

Hereinafter, examples of a parity-check matrix having the form of FIG. 3 designed by the method for designing a parity-check matrix described in the exemplary embodiment will be described.

As an example, if a codeword length $N_{ldpc}$ is 64800, a code rate R is 6/15, M is 360 and $Q_{ldpc}$ is 108, indices of a row at which one (1) is positioned in a zero (0)-th column of an i-th column group of a parity-check matrix having the structure of FIG. 3 are as shown in following Table 9.

TABLE 9

| i | Indices of rows at which 1s are positioned in 0-th column of i-th column group |
|---|---|
| 0 | 891 2309 3615 5472 8525 10308 11096 11503 11553 12420 13298 15489 15883 17561 21293 23132 25133 28163 30811 31810 34215 34584 36541 38410 |
| 1 | 3290 5479 5596 6546 7021 7566 9274 9303 10047 10278 10956 12393 18309 19755 19790 20828 22690 25235 26853 31571 31893 36500 36772 37536 |
| 2 | 1031 4765 5011 5200 6189 8985 12056 12366 14439 15482 16521 18338 19165 19476 21455 22096 22589 23699 23838 24649 30113 31490 31960 34564 |
| 3 | 1619 2364 2889 3409 7278 7384 8220 11204 11694 12064 16087 16722 19633 21525 24373 25817 29614 31392 33508 34329 34352 37006 37080 38444 |
| 4 | 3612 5474 6202 8521 11153 12202 12213 12962 13868 14359 14385 15072 15375 18156 18308 26375 28004 28905 29697 30000 30686 32819 34407 38688 |
| 5 | 1441 2527 3103 3297 6303 6421 7233 8011 8250 8909 10558 13855 14699 17508 17810 21259 22423 23264 29249 30830 32607 35202 38303 38402 |
| 6 | 4 515 1864 6876 7245 7371 9190 11814 13748 15774 20161 21526 24462 24884 25737 26251 27266 29957 34779 35082 36664 37354 37516 37837 |
| 7 | 368 4867 6985 7663 15368 15947 16235 16544 17468 18936 21544 21903 22422 23080 25411 25938 26128 29554 29847 31845 32714 36101 37324 38004 |
| 8 | 1125 2843 3161 3172 6296 8216 9506 9822 10005 11459 12555 12919 13814 13872 17916 19481 22046 23394 26020 32002 35467 36616 38306 38784 |
| 9 | 803 1133 1439 4618 5708 7048 8114 8195 9089 10238 12403 12520 14005 14194 16527 19186 20343 22595 27314 30831 35338 36223 36754 38504 |
| 10 | 988 1723 2736 2849 3827 7076 12613 12989 13268 14323 15013 20703 20872 21170 25384 29187 29524 29693 30029 30948 32598 32733 32906 34586 |
| 11 | 6085 8070 8611 10860 11848 13126 15737 19744 21503 21572 21598 22468 23444 23753 26696 26722 29679 29999 31803 32206 33479 34221 36608 38731 |
| 12 | 1410 1790 3290 7470 9833 10001 10966 11262 11687 12155 12807 16606 17295 20105 23354 23405 27107 28277 29386 30326 32151 32641 33649 36765 |
| 13 | 817 2781 2937 3886 5881 9657 10675 10816 11934 13044 16160 19321 19567 24463 26365 28182 29386 31428 31708 33113 33975 34629 36265 36650 |
| 14 | 1393 6471 7153 7266 7647 11124 13430 16396 21033 21227 23273 24502 25273 27888 29107 30726 31551 31987 32737 33126 33764 35951 36021 36264 |
| 15 | 5003 10529 15986 32408 |
| 16 | 1236 7663 14599 24745 |
| 17 | 10824 16168 16783 29318 |
| 18 | 6834 29474 29608 29779 |
| 19 | 2709 8594 20859 23739 |
| 20 | 6014 11516 14715 36702 |
| 21 | 2784 6493 27798 35084 |
| 22 | 1044 5892 13056 18720 |
| 23 | 2875 19737 21893 32447 |
| 24 | 11358 17602 34706 38472 |
| 25 | 11527 23325 28196 33428 |
| 26 | 2428 2597 3177 3909 |
| 27 | 29269 33353 33791 37487 |
| 28 | 204 14925 22290 26379 |
| 29 | 18959 19007 24212 27094 |
| 30 | 13813 14631 17097 31294 |
| 31 | 11533 17559 30617 37966 |
| 32 | 14821 22942 28281 28353 |
| 33 | 3440 8417 8534 24133 |
| 34 | 10186 20333 24737 34733 |
| 35 | 12388 31132 33131 36927 |
| 36 | 7311 16914 19363 30928 |
| 37 | 16762 23990 30952 36068 |
| 38 | 1872 9840 33270 37616 |
| 39 | 14047 17094 18244 24107 |
| 40 | 1903 21121 22616 38860 |
| 41 | 5979 16278 27327 34338 |
| 42 | 7644 10438 25622 36926 |
| 43 | 1243 27018 31393 38210 |
| 44 | 179 1944 5719 15319 |
| 45 | 17318 24311 37325 |
| 46 | 1528 10135 33640 |

TABLE 9-continued

Indices of rows at which 1s are positioned in 0-th column of i-th column group

| i | Indices |
|---|---|
| 47 | 1321 15978 25776 |
| 48 | 16957 21572 26719 |
| 49 | 14349 15799 29164 |
| 50 | 574 5582 20145 |
| 51 | 8814 14785 31081 |
| 52 | 667 7530 25659 |
| 53 | 7823 23615 37483 |
| 54 | 12766 30755 35696 |
| 55 | 4302 11660 36217 |
| 56 | 7393 11724 20441 |
| 57 | 864 13910 22924 |
| 58 | 5500 10085 31057 |
| 59 | 5399 13946 32583 |
| 60 | 1364 12423 36203 |
| 61 | 12356 24958 32026 |
| 62 | 10894 33813 38525 |
| 63 | 15456 15794 28350 |
| 64 | 6603 25570 33797 |
| 65 | 8709 19457 38831 |
| 66 | 330 9502 24362 |
| 67 | 12579 15733 34408 |
| 68 | 28443 34954 37293 |
| 69 | 3123 8513 19702 |
| 70 | 16976 22876 26384 |
| 71 | 20399 29971 33952 |

That is, positions of a row at which one (1) is positioned in a zero (0)-th column of each column group may be defined by indices of a row at which one (1) is positioned in a zero (0)-th column of an i-th column group shown in above Table 9, and, by shifting a row at which one (1) is positioned in a zero (0)-th column of each column group by $Q_{ldpc}$, rows at which one (1) is positioned in other columns of the column group may be defined.

In the foregoing example, since $Q_{ldpc}=(64800-25920)/360=108$ and the indices of the row at which one (1) is positioned in the zero (0)-th column of the zero (0)-th column group are 891, 2309, 3615, ..., the indices of the row at which one (1) is positioned in the 1-th column of the zero (0)-th column group may be 999 (=891+108), 2417 (=2309+108), 3723 (=3615+108), ... and the indices of the row at which one (1) is positioned in the second column of the zero (0)-th column group may be 1107 (=999+108), 2525 (=2417+108), 3831 (=3723+108), ....

A parity-check matrix may also be defined by the method described in above Table 9, according to an exemplary embodiment.

As another example, if a codeword length $N_{ldpc}$ is 64800, the code rate R is 8/15, M is 360 and $Q_{ldpc}$ is 84, indices of a row at which one (1) is positioned in a zero (0)-th column of an i-th column group of a parity-check matrix having the structure of FIG. 3 are as shown in following Table 10.

TABLE 10

Indices of rows at which 1s are positioned in 0-th column of i-th column group

| i | Indices |
|---|---|
| 0 | 575 3480 5049 7421 9300 10191 12344 12662 13287 13828 15934 17773 17905 18805 20237 22049 23922 25842 26477 |
| 1 | 4644 4943 6642 8110 9277 12828 13067 13101 13659 17652 17759 18222 18901 19452 21242 22878 24486 30082 30160 |
| 2 | 4600 5990 11592 11782 12150 13399 16582 17315 18200 18446 21324 21563 22895 23558 24829 26359 26379 27208 28674 |
| 3 | 727 4247 4937 8089 15745 18832 19983 20501 20832 21763 21809 22581 24885 25564 26204 26239 28375 28935 29822 |
| 4 | 2596 2687 3647 5652 7705 7911 7994 9280 10109 13037 14671 15837 17416 18970 19791 22614 23204 23504 28674 |
| 5 | 1056 3435 6648 7544 8563 10425 13131 13942 17003 19076 20132 23804 25730 25979 26464 28495 28640 29904 30054 |
| 6 | 1410 2632 3806 7856 8285 8683 8968 10120 12354 16212 16354 18750 20643 23389 23593 23821 24081 24691 27287 |
| 7 | 785 1301 2206 3442 6642 8532 10226 10372 12226 15724 17648 19961 20314 21981 25084 25517 25627 25965 30023 |
| 8 | 957 983 1450 3635 4882 5169 5906 8105 10539 11404 13286 14847 15216 15238 15705 21328 21952 23068 26520 |
| 9 | 465 2753 4029 5584 6626 7620 7688 8867 9205 9786 10661 11396 12721 12757 15181 21677 26829 28685 30125 |
| 10 | 2018 3017 5775 7512 8926 10258 11871 13763 14732 15346 17677 17762 18625 21929 22892 24994 28400 29283 29504 |
| 11 | 1686 2538 3165 3716 10989 11643 13764 14063 15621 15940 16710 16739 17442 18607 18661 21028 23820 25148 26498 |
| 12 | 983 2443 3139 8694 8930 11798 12540 13629 14446 16902 18391 18452 19745 23125 24267 24762 25491 25899 26702 |
| 13 | 744 4121 4252 9986 10475 13103 13185 14142 15345 15352 15445 17573 21329 21790 21879 23791 23840 23858 26362 |
| 14 | 1468 4636 4903 6223 7505 7748 7986 9273 11609 11821 13188 18694 19231 20890 21722 23933 25493 26809 29300 |
| 15 | 295 5207 5830 5967 9076 9476 10287 14563 14863 16497 16877 17122 17132 21298 23456 23941 24040 25165 29292 |
| 16 | 6219 6354 6512 6678 7214 7968 9600 15508 15635 17351 17825 18054 18545 21172 21604 25263 28503 29776 29957 |
| 17 | 1399 1866 4118 6022 6498 8718 8929 10364 10908 11588 13031 17426 19049 20238 23750 25217 25437 27795 30143 |
| 18 | 1263 1605 3107 5328 5522 7461 7484 9206 10185 11691 12614 12955 15109 22915 24383 26051 27802 27882 29485 |
| 19 | 684 1033 2283 3002 4245 4663 8887 9768 12403 14232 16792 18157 18826 21931 22730 25789 25975 26985 29162 |
| 20 | 2377 18147 29547 29698 |
| 21 | 3083 4540 6201 17778 |
| 22 | 468 9283 14739 24011 |
| 23 | 4848 12149 14672 26446 |
| 24 | 8851 9316 12511 18952 |
| 25 | 14327 21539 22753 28982 |
| 26 | 169 5297 12557 15108 |
| 27 | 8941 20588 23889 29192 |
| 28 | 17157 17418 24573 26133 |
| 29 | 7756 8650 28174 28806 |
| 30 | 8550 12638 19454 27484 |
| 31 | 15398 23410 25520 26808 |
| 32 | 7634 15554 19352 27115 |
| 33 | 6090 13925 17827 29331 |
| 34 | 1845 2352 5982 19601 |
| 35 | 471 1464 3191 3634 |
| 36 | 17099 18086 23525 |
| 37 | 3397 15058 30224 |
| 38 | 4864 25880 26268 |
| 39 | 1096 4775 7912 |
| 40 | 1314 3259 17301 |
| 41 | 2481 8396 15132 |
| 42 | 17825 28119 28676 |
| 43 | 2343 8382 28840 |
| 44 | 18374 20939 27091 |
| 45 | 1290 8786 15916 |
| 46 | 1481 4710 28846 |
| 47 | 2185 3705 27086 |
| 48 | 5496 15681 21854 |
| 49 | 12697 13407 22178 |
| 50 | 12788 21227 22894 |
| 51 | 2854 6232 8609 |
| 52 | 2289 18227 27458 |
| 53 | 1965 21935 23001 |
| 54 | 3836 7081 12282 |
| 55 | 1976 18845 23135 |
| 56 | 497 9717 26670 |
| 57 | 22046 27327 30067 |
| 58 | 12068 28045 28990 |
| 59 | 2023 10933 16444 |
| 60 | 19566 23905 25186 |
| 61 | 13303 13834 28813 |
| 62 | 10572 20305 21388 |
| 63 | 14093 18024 24286 |
| 64 | 3612 21383 23582 |
| 65 | 50 11267 12288 |
| 66 | 771 5652 27795 |

TABLE 10-continued

| i | Indices of rows at which 1s are positioned in 0-th column of i-th column group |
|---|---|
| 67 | 16131 20047 25649 |
| 68 | 13227 23035 24450 |
| 69 | 4839 13467 27488 |
| 70 | 2852 4677 21481 |
| 71 | 2504 4680 15664 |
| 72 | 12518 14518 24267 |
| 73 | 1222 2218 11859 |
| 74 | 9660 15774 18261 |
| 75 | 232 6424 29978 |
| 76 | 9750 11165 16295 |
| 77 | 2706 4894 28489 |
| 78 | 3301 14110 28612 |
| 79 | 2128 14436 15883 |
| 80 | 6274 17243 21989 |
| 81 | 13202 18006 22517 |
| 82 | 11159 16111 21608 |
| 83 | 3719 11563 22100 |
| 84 | 1756 2020 18861 |
| 85 | 20913 29473 30103 |
| 86 | 15091 26976 27173 |
| 87 | 8217 9114 12963 |
| 88 | 5395 18516 28235 |
| 89 | 3859 17909 23051 |
| 90 | 5733 16513 18373 |
| 91 | 1935 3492 8437 |
| 92 | 11903 16760 29914 |
| 93 | 6091 10469 29997 |
| 94 | 2895 22370 29958 |
| 95 | 1827 12296 20070 |

As another example, if a codeword length $N_{ldpc}$ is 64800, the code rate R is 10/15, M is 360 and $Q_{ldpc}$ is 60, indices of a row at which one (1) is positioned in a zero (0)-th column of an i-th column group of a parity-check matrix having the structure of FIG. 3 are as shown in following Table 11.

TABLE 11

| i | Indices of rows at which 1s are positioned in 0-th column of i-th column group |
|---|---|
| 0 | 114 2135 3045 4635 5512 5681 6571 8943 10053 10109 13161 13668 14218 17417 19328 21140 |
| 1 | 2639 2821 3066 4293 5350 8130 9037 11265 12556 15047 15364 15531 15700 16938 17202 19034 |
| 2 | 1891 4150 4822 4855 6646 9754 10460 14005 14139 15038 17213 18336 20069 20384 21305 21508 |
| 3 | 305 600 3410 5170 5740 7354 8462 9026 12763 17132 17336 17653 18450 19318 20848 21559 |
| 4 | 1961 3637 4249 4694 8298 8784 8836 11708 12241 14172 14207 15127 15462 17277 20415 20848 |
| 5 | 1101 3770 7816 8727 8890 8915 8953 11655 12826 14313 15682 19622 19854 20569 20916 21129 |
| 6 | 726 933 3015 5034 6431 6743 7477 8927 9189 9520 14280 15514 16316 17757 20237 21175 |
| 7 | 1661 3074 3745 4264 4775 7633 7666 9228 12388 12657 12718 17066 18921 19463 19511 21391 |
| 8 | 1147 3483 3544 5553 6270 6406 7146 7256 8138 9191 9623 11239 12795 16251 16435 21092 |
| 9 | 885 1061 2199 3364 5421 5549 7347 7416 11477 11874 12991 15051 16857 18933 19110 21481 |
| 10 | 292 983 1627 6121 6408 6494 6507 10642 15569 15696 16665 17024 18043 18630 19316 20029 |
| 11 | 2598 2674 3504 4931 4940 8002 9284 10729 10914 13478 13677 14033 15010 15912 16183 16612 |
| 12 | 19 768 1263 3305 6513 7677 7956 9040 13427 16641 17280 18452 18584 18925 19559 20587 |
| 13 | 1071 3472 7305 7981 8574 9609 10899 14134 15508 15665 15683 16061 16224 16604 18190 21560 |
| 14 | 2974 5834 6290 8468 9866 11177 12398 14248 14698 15726 16200 16810 16851 18373 18942 21104 |
| 15 | 519 2684 2713 2845 3000 3080 3332 4682 5062 5277 9342 10811 12636 14714 15658 16426 |
| 16 | 2272 2629 3051 4308 5301 7108 8318 8492 11305 12219 13423 16126 17763 18304 19146 20006 |
| 17 | 935 1093 1641 3562 4699 5333 5730 7628 8364 8414 10343 10555 12779 12958 16626 18985 |
| 18 | 1038 1333 1843 1910 3245 7258 7875 12098 12729 12739 16636 18689 18877 20511 20860 21299 |
| 19 | 5740 6656 6901 7066 7569 8856 8947 12582 15492 15710 17072 18638 18724 18875 21444 21563 |
| 20 | 962 990 1199 2979 3341 8322 9285 9652 10387 11404 12387 13495 14066 16325 16514 18732 |
| 21 | 387 1248 2298 3376 5408 7817 7923 8203 8816 9451 11292 13649 14291 17993 19629 19739 |
| 22 | 84 1177 1363 3189 4699 6746 9707 10308 10460 10992 11873 13531 13696 14522 15050 20717 |
| 23 | 713 960 2672 4688 6602 6769 6783 10075 12807 14411 15527 15575 19179 19878 20477 21517 |
| 24 | 12575 15845 18200 |
| 25 | 5870 6972 16463 |
| 26 | 2025 3655 15396 |
| 27 | 4258 6387 14477 |
| 28 | 12282 12783 13274 |
| 29 | 1657 10810 12509 |
| 30 | 839 8734 21409 |
| 31 | 4038 5993 15640 |
| 32 | 3025 15282 16231 |
| 33 | 4342 7977 17828 |
| 34 | 14144 16500 21426 |
| 35 | 592 4952 15367 |
| 36 | 8156 8859 13113 |
| 37 | 7267 9133 20155 |
| 38 | 17111 17306 21301 |
| 39 | 2655 5258 14267 |
| 40 | 5844 13026 18796 |
| 41 | 2681 5686 15609 |
| 42 | 2031 3980 4228 |
| 43 | 75 18922 20730 |
| 44 | 18712 20866 21302 |
| 45 | 10974 13003 20481 |
| 46 | 4494 6964 18238 |
| 47 | 3679 12972 13411 |
| 48 | 13207 16406 19548 |
| 49 | 6039 6320 14581 |
| 50 | 4721 20336 20819 |
| 51 | 2797 15321 20509 |
| 52 | 8307 8774 19113 |
| 53 | 3394 10487 13963 |
| 54 | 4325 12098 14305 |
| 55 | 13667 19264 19649 |
| 56 | 1163 16176 20823 |
| 57 | 2324 10790 14560 |
| 58 | 12791 14068 17743 |
| 59 | 9765 12262 20117 |
| 60 | 1456 11096 13570 |
| 61 | 6900 7111 15217 |
| 62 | 4009 5995 7322 |
| 63 | 10673 11315 17310 |
| 64 | 5792 10504 18221 |
| 65 | 4748 14299 16554 |
| 66 | 4176 14868 20718 |
| 67 | 6147 9429 15884 |
| 68 | 9044 10345 21417 |
| 69 | 7737 7873 11969 |
| 70 | 3924 4494 8326 |
| 71 | 5535 6651 16116 |
| 72 | 11 6993 20602 |
| 73 | 15798 17918 19172 |
| 74 | 1181 11171 13206 |
| 75 | 4040 4567 18197 |
| 76 | 1255 11889 17730 |
| 77 | 2099 5538 14774 |
| 78 | 482 5768 7475 |
| 79 | 3418 4801 20715 |
| 80 | 5925 16632 20285 |
| 81 | 2034 11271 21000 |
| 82 | 7238 8108 20848 |
| 83 | 193 11374 15841 |
| 84 | 5056 9673 12441 |

TABLE 11-continued

| i | Indices of rows at which 1s are positioned in 0-th column of i-th column group |
|---|---|
| 85 | 8026 17906 18037 |
| 86 | 162 4432 8739 |
| 87 | 1582 5268 20880 |
| 88 | 3494 17600 18684 |
| 89 | 3029 6710 11442 |
| 90 | 9289 19099 19407 |
| 91 | 7802 9130 20598 |
| 92 | 5140 8731 15358 |
| 93 | 14153 16376 19323 |
| 94 | 4847 11843 21567 |
| 95 | 4840 14455 17248 |
| 96 | 1117 4061 13355 |
| 97 | 7636 9748 21108 |
| 98 | 9068 13023 13346 |
| 99 | 1139 14402 20245 |
| 100 | 2190 11366 17004 |
| 101 | 2989 5524 8199 |
| 102 | 8489 8899 15486 |
| 103 | 6683 6970 13387 |
| 104 | 3745 9975 15713 |
| 105 | 1250 4246 5973 |
| 106 | 8941 9992 17805 |
| 107 | 7986 13776 21297 |
| 108 | 2781 3232 16020 |
| 109 | 7654 15969 16071 |
| 110 | 4002 13033 19217 |
| 111 | 4603 7439 9192 |
| 112 | 1390 8673 18485 |
| 113 | 4845 6024 14633 |
| 114 | 6083 14165 15640 |
| 115 | 9652 13452 21404 |
| 116 | 4196 7787 17371 |
| 117 | 2959 6783 13581 |
| 118 | 11596 18575 20878 |
| 119 | 17078 20134 20870 |

As another example, if a codeword length $N_{ldpc}$ is 64800, the code rate R is 12/15, M is 360 and $Q_{ldpc}$ is 36, indices of a row at which one (1) is positioned in a zero (0)-th column of an i-th column group of a parity-check matrix having the structure of FIG. 3 are as shown in following Table 12.

TABLE 12

| i | Indices of rows at which 1s are positioned in 0-th column of i-th column group |
|---|---|
| 0 | 57 3127 3324 3362 3471 4108 4850 5588 5721 6436 6845 9325 11745 12956 |
| 1 | 651 893 1879 2641 2807 4123 4406 5364 6346 8530 9387 10301 11047 12660 |
| 2 | 1925 2592 2655 4108 4433 4544 4614 7081 7254 7759 7815 9121 9453 10613 |
| 3 | 718 1559 1859 2697 3739 3948 4506 4982 6898 7410 7569 8243 10840 12075 |
| 4 | 21 1387 1645 1980 4188 4751 6148 7864 8498 8647 9715 10513 11114 12910 |
| 5 | 1082 2045 2395 3663 4597 4727 7055 8123 8189 8618 8782 11114 11716 12211 |
| 6 | 312 951 2269 2569 4820 4972 5803 5816 6406 6861 8277 8398 9349 10816 |
| 7 | 20 1833 2300 4962 5267 5653 6215 7098 7434 7509 9235 10331 10731 11060 |
| 8 | 594 1091 1743 1809 2686 3095 3316 5381 5927 6115 7100 7750 9901 11091 |
| 9 | 1065 1236 1716 2628 4589 5164 5209 6502 7719 10107 11333 11599 12011 12893 |
| 10 | 1799 2958 3999 4196 4351 4358 5019 5128 5840 6154 6961 9328 10530 11440 |
| 11 | 2982 3133 4612 4776 4986 6276 6992 7372 7589 7831 8109 8619 11594 12694 |
| 12 | 282 3140 3300 4219 4459 5189 5525 6753 8154 8522 8931 9073 10019 10654 |

TABLE 12-continued

| i | Indices of rows at which 1s are positioned in 0-th column of i-th column group |
|---|---|
| 13 | 298 1137 3973 4000 7328 7923 8602 8734 8792 9419 9748 9988 10200 10985 |
| 14 | 1142 1639 1997 3951 4388 4638 5676 6478 6738 6927 8643 8793 11528 11949 |
| 15 | 629 1735 3072 3268 3585 3888 4491 4622 5294 6817 6829 9003 9930 10426 |
| 16 | 486 1200 1594 2713 3273 3440 4667 5247 7304 7901 8302 8576 9014 10180 |
| 17 | 2377 2471 3742 5186 7137 9518 9798 10029 10060 11052 12109 12660 12716 12762 |
| 18 | 175 1242 2118 4101 4130 6252 6598 7272 7342 7834 7859 7924 10940 11032 |
| 19 | 550 1349 2360 2373 2895 3442 5258 5695 8512 8882 10710 11562 11940 12432 |
| 20 | 1791 2788 4958 5573 5917 5952 6195 7376 7920 7971 8983 10817 10883 11550 |
| 21 | 639 1000 2387 2429 3548 3659 4186 6741 7490 8383 8760 9392 9649 11971 |
| 22 | 523 1269 2262 2987 3073 3811 4227 5028 5181 8471 8712 9421 9509 11871 |
| 23 | 117 266 505 1967 2620 3188 5282 7194 8119 8251 8290 10433 12174 12337 |
| 24 | 896 3196 3714 4979 5258 5584 5945 7142 7713 9745 9789 11252 11339 11945 |
| 25 | 864 2383 2594 3398 5969 6116 6418 6649 7199 7242 8169 9221 9740 9890 |
| 26 | 1334 1487 12881 |
| 27 | 1447 4633 11032 |
| 28 | 273 1257 10453 |
| 29 | 5102 10999 12496 |
| 30 | 7578 9743 10513 |
| 31 | 7156 10266 10546 |
| 32 | 3199 7369 7824 |
| 33 | 2354 7674 8569 |
| 34 | 3687 9478 12663 |
| 35 | 2997 9418 9581 |
| 36 | 6519 8081 11229 |
| 37 | 9894 9899 11254 |
| 38 | 6 9344 11731 |
| 39 | 9612 12680 12776 |
| 40 | 353 10896 11643 |
| 41 | 945 2537 9804 |
| 42 | 2915 8984 11098 |
| 43 | 2353 4884 7456 |
| 44 | 6003 8924 11646 |
| 45 | 349 748 8625 |
| 46 | 4799 7204 12240 |
| 47 | 2464 8958 11020 |
| 48 | 1915 2903 12358 |
| 49 | 2246 3032 12531 |
| 50 | 2594 12742 12914 |
| 51 | 2002 10995 12079 |
| 52 | 853 1049 5022 |
| 53 | 4142 4301 6413 |
| 54 | 914 3882 12047 |
| 55 | 5479 10413 11225 |
| 56 | 228 6874 11183 |
| 57 | 2836 9737 10728 |
| 58 | 1795 9981 12734 |
| 59 | 2641 2844 11779 |
| 60 | 1245 9983 12804 |
| 61 | 6002 8612 9704 |
| 62 | 1237 1760 7504 |
| 63 | 844 1485 5869 |
| 64 | 2657 4461 5642 |
| 65 | 2423 4203 9111 |
| 66 | 244 1855 6131 |
| 67 | 5318 6371 11430 |
| 68 | 391 1617 10126 |
| 69 | 1762 9259 10603 |
| 70 | 2604 4335 6702 |
| 71 | 4381 5486 8045 |
| 72 | 7667 8875 11451 |
| 73 | 1968 4023 6911 |
| 74 | 4630 10184 11357 |
| 75 | 6582 12348 12769 |
| 76 | 3840 6302 7388 |

TABLE 12-continued

| i | Indices of rows at which 1s are positioned in 0-th column of i-th column group |
|---|---|
| 77 | 1 4197 5358 |
| 78 | 1265 3153 11352 |
| 79 | 2504 7180 10044 |
| 80 | 1980 5027 9717 |
| 81 | 5699 6899 9668 |
| 82 | 1432 2803 3314 |
| 83 | 1237 8470 9642 |
| 84 | 829 6745 7923 |
| 85 | 329 1931 5575 |
| 86 | 1067 6867 7257 |
| 87 | 4744 5559 7835 |
| 88 | 109 6756 12238 |
| 89 | 2814 5237 11153 |
| 90 | 1592 10696 10749 |
| 91 | 225 2293 6260 |
| 92 | 646 2170 7578 |
| 93 | 6466 8222 9838 |
| 94 | 44 6574 12160 |
| 95 | 1755 2734 12780 |
| 96 | 1249 8264 8318 |
| 97 | 5789 6622 9481 |
| 98 | 5666 8681 8744 |
| 99 | 123 5803 9291 |
| 100 | 3750 7919 9167 |
| 101 | 1064 2848 12753 |
| 102 | 2142 8656 9244 |
| 103 | 6193 7219 11732 |
| 104 | 7356 7819 9928 |
| 105 | 4780 5937 11993 |
| 106 | 5092 7186 9141 |
| 107 | 1238 3840 12360 |
| 108 | 1649 2096 2587 |
| 109 | 5560 5903 12899 |
| 110 | 1134 4341 8330 |
| 111 | 1645 9495 10041 |
| 112 | 9585 11595 12912 |
| 113 | 8748 10646 11894 |
| 114 | 45 7255 9074 |
| 115 | 1051 2694 6188 |
| 116 | 622 3460 8394 |
| 117 | 3598 4623 9025 |
| 118 | 1218 3540 12843 |
| 119 | 4938 8698 12423 |
| 120 | 1766 3635 11427 |
| 121 | 5177 6706 9127 |
| 122 | 943 3590 10245 |
| 123 | 4864 7394 11117 |
| 124 | 5852 6042 10421 |
| 125 | 8285 10775 12349 |
| 126 | 787 7171 7866 |
| 127 | 718 4688 12234 |
| 128 | 728 2353 10667 |
| 129 | 3629 4592 6485 |
| 130 | 2880 5157 11466 |
| 131 | 2906 10220 11796 |
| 132 | 4243 5440 10907 |
| 133 | 5262 7543 12303 |
| 134 | 4440 7779 10940 |
| 135 | 2515 5843 9202 |
| 136 | 4684 8874 10586 |
| 137 | 2270 7197 8652 |
| 138 | 7190 7870 8317 |
| 139 | 1158 10456 12909 |
| 140 | 1583 7669 10781 |
| 141 | 8141 11209 12555 |
| 142 | 3181 3903 7832 |
| 143 | 2428 4467 8074 |

Meanwhile, in the design process of codes, the process of step 4 uses the lifting method considering the cycle characteristics. When various algebraic characteristics as well as the cycle characteristics are additionally considered, codes having better performance may also be designed.

Generally, since the performance of the LDPC codes affects the degree distribution as well as the cycle characteristics, codes having better performance may be designed in consideration of both of the two characteristics.

According to an exemplary embodiment, parameters may be determined depending on cycles having the shortest length and the number of variable nodes included in these cycles and having a specific degree, and a sequence may be determined depending on a rule determined based on the parameters in a lifting step.

For example, when the lifting process is applied to a column group of which the degrees are A and B, only a cycle in which the number of variable nodes of which the degree is A among the variable nodes included in the cycle while the lifting of the column group of which the degree is A is performed is $x_1$ or less and a value of the variable nodes (the number of variable nodes of which the degree is A+the number of variable nodes of which the degree is B×C) included in the cycle while the lifting of the column group of which the degree is B is $x_2$ or less may be considered.

However, all cycles are considered when the lifting process is applied to the column groups of which the degrees are not A and B.

Here, A is a positive integer of two (2) or more, B is a positive integer larger than A and smaller than a maximum degree of the parity-check matrix, and C is a weighting factor and has a positive integer value.

In addition, all cycles are considered without distinction of a specific cycle when the lifting process is applied to the column groups of which the degrees are not A and B.

As a specific example, the case in which A=3, B=4, and C=2 will be described.

For example, in the lifting process, the lifting is performed in consideration of only cycles in which the number of variable nodes (which is equivalent to columns) of which the degree is three (3) among the variable nodes included in the cycles in the process of performing the lifting of column groups of which the degrees are three (3) is $x_1$ or less and (the number of variable nodes of which the degree is 4×2+the number of variable nodes of which the degree is three (3)) among variable nodes included in the cycles in the process of performing the lifting of column groups of which the degree is four (4) is $x_2$ or less.

That is, when the index values are changed in the lifting process, the lifting process is repeated until the number of variable nodes having the cycles is not improved to change the index values depending on the degrees of each variable node in consideration of only the cycles corresponding to the conditions.

Generally, in simple lifting, a parity-check matrix is designed so that the number of cycles is decreased. In this process, the parity-check matrix is designed such that the number of cycles meeting the above-mentioned conditions is decreased.

The reason why the above-mentioned conditions affect the design of LDPC codes having better performance is that the cycles and the degree distributions affecting the LDPC codes have been considered in the above-mentioned conditions.

Examples of the LDPC codes designed in consideration of these additional conditions are shown in following Tables 13 to 18. For reference, the same length and code rate as those of the LDPC codes as shown in above Tables 9 to 12 are designed, values ($x_1$, $x_2$) considered in following Table 13 are equal to (4, 5), values ($x_1$, $x_2$) considered in following Table 14 is equal to (4, 5), ($x_1$, $x_2$) considered in following Table 15 are equal to (3, 4), and values ($x_1$, $x_2$) considered in following Table 16 are equal to (3, 4). Further, values ($x_1$, $x_2$) considered in following Table 17 are equal to (8, 8) and ($x_1$, $x_2$) considered in following Table 18 is equal to (3, 4).

As an example of results designed in consideration of these additional conditions, if a codeword length $N_{ldpc}$ is 64800, a code rate R is 6/15, M is 360, and $Q_{ldpc}$ is 108, indices of a row at which one (1) is positioned in a zero (0)-th column of an i-th column group of a parity-check matrix having the structure of FIG. 3 are as shown in following Table 13.

TABLE 13

| i | Indices of rows at which 1s are positioned in 0-th column of i-th column group |
|---|---|
| 0 | 253 1553 2024 4493 5350 5664 6351 8563 8803 9576 9936 11995 12166 13193 13412 17088 21893 22167 22478 22673 23735 35313 36981 37527 |
| 1 | 1238 1701 2316 3621 7222 8387 9190 10178 10599 10744 11743 18179 22465 23562 23820 26493 28168 28515 28940 29982 31196 32946 33687 34305 |
| 2 | 1475 1874 2994 3168 3381 3988 7646 9309 11199 12856 15025 16586 20113 23155 24030 27491 28235 29392 30885 32896 33656 33785 34685 38713 |
| 3 | 512 721 1813 3144 3276 6198 13540 14553 15017 15548 16120 17449 19101 19763 24180 25629 27612 29682 30910 32038 35346 36607 36836 37876 |
| 4 | 333 1124 3269 4236 4920 5207 6154 7041 7282 7979 8472 9302 10033 14295 15888 16485 18963 24572 26642 27516 30242 31209 32000 33259 |
| 5 | 2528 4425 4656 6631 8875 10621 12590 13334 14011 16406 16937 18942 20315 24078 24889 27298 29555 30123 30513 33101 33403 33787 36651 37975 |
| 6 | 414 721 898 2093 3813 8358 9316 11235 12032 12568 14339 14908 15390 19210 19450 22689 22840 28044 31218 35042 35348 35863 37611 37837 |
| 7 | 979 3559 4988 6900 7254 7491 11518 12297 12928 14894 15473 16179 16667 17744 20983 22854 24913 25640 28792 29536 30428 32284 33732 34523 |
| 8 | 353 1877 2171 5080 7140 7878 8762 11558 14836 15000 15513 16490 17423 18943 21094 22348 23394 24182 26203 28328 32408 34284 38061 38259 |
| 9 | 142 1961 5219 5816 9555 10358 10675 15251 15716 16079 20566 21470 23007 25419 27130 28000 28693 30742 30862 33209 33472 33851 35546 36115 |
| 10 | 1388 4346 5764 6052 7940 9207 13401 13603 14233 14411 16310 16598 22524 22824 26535 27965 28433 30605 31984 34241 35730 36139 37261 37720 |
| 11 | 106 1441 3892 4300 5026 7207 8648 14012 15828 17007 19409 22942 26363 28363 28806 29351 29722 33033 35204 35315 35824 37901 38036 38643 |
| 12 | 2607 5309 6506 9122 9318 9889 10322 12074 13373 14058 15341 15774 18154 18749 21949 27887 29885 31294 31487 32769 32890 37983 38403 38879 |
| 13 | 2154 4374 10366 10605 11179 15994 18855 20342 23936 24777 25768 26371 26745 27049 27324 27493 27985 29781 30148 33240 33673 34441 35057 35731 |
| 14 | 3054 6385 6561 6755 7795 9366 10392 12042 12832 14851 16187 17441 18536 20967 21792 24084 24505 26677 28167 28334 35199 36745 37533 37786 |
| 15 | 2735 3833 10268 17606 |
| 16 | 559 9607 17652 34573 |
| 17 | 9528 12139 14306 38416 |
| 18 | 11978 17094 25891 30040 |
| 19 | 14811 15531 27333 31274 |
| 20 | 12926 28602 32103 35600 |
| 21 | 8616 14917 18992 23478 |
| 22 | 7416 8568 10248 36672 |
| 23 | 3611 15521 17793 32467 |
| 24 | 4662 7908 8894 32722 |
| 25 | 8156 28077 32840 35719 |
| 26 | 977 17949 23380 26181 |
| 27 | 7655 9515 12185 17821 |
| 28 | 1107 8520 16782 23241 |
| 29 | 16942 19784 22031 22955 |
| 30 | 1054 23163 23793 37789 |
| 31 | 8509 17981 22306 33327 |
| 32 | 2253 11397 16225 30826 |
| 33 | 23654 30073 31421 33140 |
| 34 | 18286 19445 29945 38405 |

TABLE 13-continued

| i | Indices of rows at which 1s are positioned in 0-th column of i-th column group |
|---|---|
| 35 | 7535 8608 21915 38260 |
| 36 | 11082 13972 17895 18931 |
| 37 | 8114 25376 25660 33718 |
| 38 | 3380 5946 20124 37272 |
| 39 | 10159 18822 22456 29291 |
| 40 | 15289 18016 18512 37003 |
| 41 | 18471 19326 27834 28119 |
| 42 | 15326 28272 36142 37826 |
| 43 | 12277 20646 22411 22658 |
| 44 | 12199 23328 35495 36055 |
| 45 | 17318 24311 29009 |
| 46 | 1528 32815 33640 |
| 47 | 15978 19141 25776 |
| 48 | 8683 11960 16957 |
| 49 | 15799 20829 29164 |
| 50 | 574 5582 20145 |
| 51 | 8814 18673 31081 |
| 52 | 8394 25659 36739 |
| 53 | 23615 32879 37483 |
| 54 | 12766 30755 35696 |
| 55 | 4302 18788 25093 |
| 56 | 13205 14424 33529 |
| 57 | 864 16070 22924 |
| 58 | 7120 10085 31057 |
| 59 | 5399 13946 32583 |
| 60 | 1364 12423 19355 |
| 61 | 12356 24958 32026 |
| 62 | 11997 25582 36581 |
| 63 | 6074 9516 18414 |
| 64 | 7102 22587 33797 |
| 65 | 8709 19457 38831 |
| 66 | 9502 10266 24362 |
| 67 | 1801 12579 34408 |
| 68 | 471 34954 37293 |
| 69 | 1666 3123 8513 |
| 70 | 9160 11576 26384 |
| 71 | 14311 20399 33952 |

As another example of results designed in consideration of these additional conditions, if codeword length $N_{ldpc}$ is 64800, a code rate R is 8/15, M is 360, and $Q_{ldpc}$ is 84, indices of a row at which one (1) is positioned in a zero (0)-th column of an i-th column group of a parity-check matrix having the structure of FIG. 3 are as shown in following Table 14.

TABLE 14

| i | Indices of rows at which 1s are positioned in 0-th column of i-th column group |
|---|---|
| 0 | 2768 3039 4059 5856 6245 7013 8157 9341 9802 10470 11521 12083 16610 18361 20321 24601 27420 28206 29788 |
| 1 | 2739 8244 8891 9157 12624 12973 15534 16622 16919 18402 18780 19854 20220 20543 22306 25540 27478 27678 28053 |
| 2 | 1727 2268 6246 7815 9010 9556 10134 10472 11389 14599 15719 16204 17342 17666 18850 22058 25579 25860 29207 |
| 3 | 28 1346 3721 5565 7019 9240 12355 13109 14800 16040 16839 17369 17631 19357 19473 19891 20381 23911 29683 |
| 4 | 869 2450 4386 5316 6160 7107 10362 11132 11271 13149 16397 16532 17113 19894 22043 22784 27383 28615 28804 |
| 5 | 508 4292 5831 8559 10044 10412 11283 14810 15888 17243 17538 19903 20528 22090 22652 27235 27384 28208 28485 |
| 6 | 389 2248 5840 6043 7000 9054 11075 11760 12217 12565 13587 15403 19422 19528 21493 25142 27777 28566 28702 |
| 7 | 1015 2002 5764 6777 9346 9629 11039 11153 12690 13068 13990 16841 17702 20021 24106 26300 29332 30081 30196 |
| 8 | 1480 3084 3467 4401 4798 5187 7851 11368 12323 14325 14546 16360 17158 18010 21333 25612 26556 26906 27005 |
| 9 | 6925 8876 12392 14529 15253 15437 19226 19950 20321 23021 23651 24393 24653 26668 27205 28269 28529 29041 29292 |
| 10 | 2547 3404 3538 4666 5126 5468 7695 8799 14732 15072 15881 17410 18971 19609 19717 22150 24941 27908 29018 |

TABLE 14-continued

| i | Indices of rows at which 1s are positioned in 0-th column of i-th column group |
|---|---|
| 11 | 888 1581 2311 5511 7218 9107 10454 12252 13662 15714 15894 17025 18671 24304 25316 25556 28489 28977 29212 |
| 12 | 1047 1494 1718 4645 5030 6811 7868 8146 10611 15767 17682 18391 22614 23021 23763 25478 26491 29088 29757 |
| 13 | 59 1781 1900 3814 4121 8044 8906 9175 11156 14841 15789 16033 16755 17292 18550 19310 22505 29567 29850 |
| 14 | 1952 3057 4399 9476 10171 10769 11335 11569 15002 19501 20621 22642 23452 24360 25109 25290 25828 28505 29122 |
| 15 | 2895 3070 3437 4764 4905 6670 9244 11845 13352 13573 13975 14600 15871 17996 19672 20079 20579 25327 27958 |
| 16 | 612 1528 2004 4244 4599 4926 5843 7684 10122 10443 12267 14368 18413 19058 22985 24257 26202 26596 27899 |
| 17 | 1361 2195 4146 6708 7158 7538 9138 9998 14862 15359 16076 18925 21401 21573 22503 24146 24247 27778 29312 |
| 18 | 5229 6235 7134 7655 9139 13527 15408 16058 16705 18320 19909 20901 22238 22437 23654 25131 27550 28247 29903 |
| 19 | 697 2035 4887 5275 6909 9166 11805 15338 16381 18403 20425 20688 21547 24590 25171 26726 28348 29224 29412 |
| 20 | 5379 17329 22659 23062 |
| 21 | 11814 14759 22329 22936 |
| 22 | 2423 2811 10296 12727 |
| 23 | 8460 15260 16769 17290 |
| 24 | 14191 14608 29536 30187 |
| 25 | 7103 10069 20111 22850 |
| 26 | 4285 15413 26448 29069 |
| 27 | 548 2137 9189 10928 |
| 28 | 4581 7077 23382 23949 |
| 29 | 3942 17248 19486 27922 |
| 30 | 8668 10230 16922 26678 |
| 31 | 6158 9980 13788 28198 |
| 32 | 12422 16076 24206 29887 |
| 33 | 8778 10649 18747 22111 |
| 34 | 21029 22677 27150 28980 |
| 35 | 7918 15423 27672 27803 |
| 36 | 5927 18086 23525 |
| 37 | 3397 15058 30224 |
| 38 | 24016 25880 26268 |
| 39 | 1096 4775 7912 |
| 40 | 3259 17301 20802 |
| 41 | 129 8396 15132 |
| 42 | 17825 28119 28676 |
| 43 | 2343 8382 28840 |
| 44 | 3907 18374 20939 |
| 45 | 1132 1290 8786 |
| 46 | 1481 4710 28846 |
| 47 | 2185 3705 26834 |
| 48 | 5496 15681 21854 |
| 49 | 12697 13407 22178 |
| 50 | 12788 21227 22894 |
| 51 | 629 2854 6232 |
| 52 | 2289 18227 27458 |
| 53 | 7593 21935 23001 |
| 54 | 3836 7081 12282 |
| 55 | 7925 18440 23135 |
| 56 | 497 6342 9717 |
| 57 | 11199 22046 30067 |
| 58 | 12572 28045 28990 |
| 59 | 1240 2023 10933 |
| 60 | 19566 20629 25186 |
| 61 | 6442 13303 28813 |
| 62 | 4765 10572 16180 |
| 63 | 552 19301 24286 |
| 64 | 6782 18480 21383 |
| 65 | 11267 12288 15758 |
| 66 | 771 5652 15531 |
| 67 | 16131 20047 25649 |
| 68 | 13227 23035 24450 |
| 69 | 4839 13467 27488 |
| 70 | 2352 4677 22993 |
| 71 | 2504 28116 29524 |
| 72 | 12518 17374 24267 |
| 73 | 1222 11859 27922 |
| 74 | 9660 17286 18261 |
| 75 | 232 11296 29978 |
| 76 | 9750 11165 16295 |
| 77 | 4894 9505 23622 |
| 78 | 10861 11980 14110 |
| 79 | 2128 15883 22836 |
| 80 | 6274 17243 21989 |
| 81 | 10866 13202 22517 |
| 82 | 11159 16111 21608 |
| 83 | 3719 18787 22100 |
| 84 | 1756 2020 23901 |
| 85 | 20913 29473 30103 |
| 86 | 2729 15091 26976 |
| 87 | 4410 8217 12963 |
| 88 | 5395 24564 28235 |
| 89 | 3859 17909 23051 |
| 90 | 5733 26005 29797 |
| 91 | 1935 3492 29773 |
| 92 | 11903 21380 29914 |
| 93 | 6091 10469 29997 |
| 94 | 2895 8930 15594 |
| 95 | 1827 10028 20070 |

As another example of results designed in consideration of these additional conditions, if a codeword length $N_{ldpc}$ is 64800, a code rate R is 10/15, M is 360, and $Q_{ldpc}$ is 60, indices of a row at which one (1) is positioned in a zero (0)-th column of an i-th column group of a parity-check matrix having the structure of FIG. 3 are as shown in following Table 15.

TABLE 15

| i | Indices of rows at which 1s are positioned in 0-th column of i-th column group |
|---|---|
| 0 | 501 1533 5943 9232 10258 10428 10965 11934 14081 14708 15509 17251 18380 19815 20075 20237 |
| 1 | 753 1266 2017 3107 4210 4770 6520 10861 11594 13191 14116 18342 18604 18825 19398 21479 |
| 2 | 2379 3029 3140 3398 4528 6562 8575 9593 11196 11585 12931 13064 13825 15886 20854 21010 |
| 3 | 733 1262 2250 4910 8165 8374 8698 10543 10930 12940 14520 14936 15752 16879 19226 20188 |
| 4 | 2056 2341 4237 4807 6469 7708 8895 9548 13274 13404 13481 14082 15647 17712 19377 19638 |
| 5 | 2882 3081 3633 4047 4755 5094 5589 6709 12526 12710 12910 13342 14196 17836 20353 21095 |
| 6 | 34 309 1187 3000 3097 3246 6280 6873 7074 8935 12615 13517 14363 16317 19856 20591 |
| 7 | 2181 2381 3551 6904 6995 8248 9023 9348 9433 11097 12914 17326 17671 18658 19585 20846 |
| 8 | 915 2036 2104 2790 3606 4763 6319 7807 8918 9311 13431 15723 19953 20935 21092 21286 |
| 9 | 1921 2131 2321 3114 4589 5133 5477 8265 9891 13941 14404 15777 17310 17787 18399 20916 |
| 10 | 1612 3502 3696 5084 6421 7410 7723 8467 8787 9434 11516 14329 14505 17723 19229 19308 |
| 11 | 2900 3311 3430 3984 4843 5422 6049 7374 7572 11037 15112 15173 17144 20378 20718 20854 |
| 12 | 4685 4896 7712 9120 10019 11988 12657 12907 13113 13519 14384 15347 16180 17125 19923 20661 |
| 13 | 189 2543 5548 6001 8979 9224 12641 13404 13505 13674 16011 16234 16820 17230 18945 19912 |
| 14 | 788 6540 7724 9898 13150 13817 15313 15554 15928 16118 17734 18170 18386 19422 20106 20931 |
| 15 | 4779 4964 6722 8474 9298 10620 11326 11471 12897 13482 15805 17076 18193 18260 20122 21392 |
| 16 | 385 2524 3486 4503 6708 7712 8632 8908 9283 10826 12081 12699 16551 16846 19058 20749 |
| 17 | 1405 1748 3058 4219 9053 9906 10581 11242 11515 14910 15143 16499 18395 18853 19454 21264 |
| 18 | 1875 2716 5358 6878 7089 8758 9659 11909 12290 12697 14631 17200 18305 18973 19159 21583 |
| 19 | 683 1564 1718 3350 3940 5672 6189 9361 11347 11915 13236 15946 16404 18372 21116 21282 |

TABLE 15-continued

| i | Indices of rows at which 1s are positioned in 0-th column of i-th column group |
|---|---|
| 20 | 962 4602 5035 5827 8007 10139 11524 11970 13479 13586 16061 18532 18705 19152 19625 20054 |
| 21 | 497 1698 1976 2383 2823 3479 7527 9948 11889 13649 14491 15431 16868 17232 18316 20453 |
| 22 | 1029 6199 8477 9707 10400 10913 11617 11923 12482 14690 14988 15796 16104 19272 20426 20731 |
| 23 | 95 953 1208 1818 5640 5797 8852 9399 9595 10877 11087 13129 15122 16631 17643 18867 |
| 24 | 12575 12680 15845 |
| 25 | 5870 6972 16463 |
| 26 | 2025 3655 7716 |
| 27 | 4258 6387 14477 |
| 28 | 12282 13274 18603 |
| 29 | 1657 10810 12509 |
| 30 | 839 8734 21409 |
| 31 | 4038 5993 15640 |
| 32 | 14005 15282 18931 |
| 33 | 4342 7977 17828 |
| 34 | 14144 16500 21426 |
| 35 | 592 4952 13747 |
| 36 | 8156 8859 18093 |
| 37 | 5995 7267 9133 |
| 38 | 5581 17111 17306 |
| 39 | 3218 7635 14267 |
| 40 | 5844 13026 18796 |
| 41 | 5686 12821 15609 |
| 42 | 3980 4228 7731 |
| 43 | 75 18922 20730 |
| 44 | 18712 20866 21302 |
| 45 | 10674 13003 20481 |
| 46 | 1914 6964 18238 |
| 47 | 12972 13411 21559 |
| 48 | 13207 16406 19548 |
| 49 | 4021 6039 6320 |
| 50 | 4721 20336 20819 |
| 51 | 2797 15321 20509 |
| 52 | 8187 8774 19113 |
| 53 | 3634 10487 13963 |
| 54 | 3205 4325 12098 |
| 55 | 1444 4409 13667 |
| 56 | 1163 5856 7623 |
| 57 | 2324 10790 14560 |
| 58 | 1468 12791 17743 |
| 59 | 9765 12262 20117 |
| 60 | 1456 4150 11096 |
| 61 | 6900 9631 15217 |
| 62 | 4009 5995 7322 |
| 63 | 10673 11315 17310 |
| 64 | 5792 10504 18221 |
| 65 | 4748 14299 14994 |
| 66 | 4176 14868 20718 |
| 67 | 6147 15884 19749 |
| 68 | 9044 10345 20757 |
| 69 | 5817 7873 11969 |
| 70 | 3114 3924 8326 |
| 71 | 5535 6651 16116 |
| 72 | 7642 16391 17673 |
| 73 | 15798 17918 19172 |
| 74 | 1181 5291 17166 |
| 75 | 4220 4567 18197 |
| 76 | 1255 17730 19449 |
| 77 | 2099 5538 14774 |
| 78 | 6542 7475 17228 |
| 79 | 3418 4801 20715 |
| 80 | 1145 4245 16632 |
| 81 | 2034 11271 21000 |
| 82 | 7238 8108 15208 |
| 83 | 193 11374 15841 |
| 84 | 1333 5056 12441 |
| 85 | 8026 17906 18037 |
| 86 | 162 4432 8739 |
| 87 | 4762 5268 8940 |
| 88 | 3494 6384 17600 |
| 89 | 3029 6710 11442 |
| 90 | 919 9289 19407 |
| 91 | 9130 17762 20598 |
| 92 | 5140 17911 20878 |
| 93 | 14153 16376 19323 |
| 94 | 3863 4847 21567 |
| 95 | 2608 4840 14455 |
| 96 | 1117 4061 5255 |
| 97 | 13468 14536 14928 |
| 98 | 9068 13023 13346 |
| 99 | 1139 14402 15445 |
| 100 | 2190 17004 17906 |
| 101 | 2989 5524 12399 |
| 102 | 8489 8899 15486 |
| 103 | 6683 6970 13387 |
| 104 | 3745 9975 17753 |
| 105 | 1250 4246 17193 |
| 106 | 9992 19441 19965 |
| 107 | 5796 7986 21297 |
| 108 | 2781 3232 16020 |
| 109 | 6891 7654 15969 |
| 110 | 4002 13033 19217 |
| 111 | 7439 9192 13183 |
| 112 | 1390 8673 18485 |
| 113 | 24 4845 14633 |
| 114 | 6083 14765 15640 |
| 115 | 9652 13452 21404 |
| 116 | 7787 10616 17371 |
| 117 | 2959 6783 13581 |
| 118 | 11596 18575 20878 |
| 119 | 8318 14614 20870 |

As another example of results designed in consideration of these additional conditions, if a codeword length $N_{ldpc}$ is 64800, a code rate R is 12/15, M is 360, and $Q_{ldpc}$ is 36, indices of a row at which one (1) is positioned in a zero (0)-th column of an i-th column group of a parity-check matrix having the structure of FIG. 3 are as shown in following Table 16.

TABLE 16

| i | Indices of rows at which 1s are positioned in 0-th column of i-th column group |
|---|---|
| 0 | 584 1472 1621 1867 3338 3568 3723 4185 5126 5889 7737 8632 8940 9725 |
| 1 | 221 445 590 3779 3835 6939 7743 8280 8448 8491 9367 10042 11242 12917 |
| 2 | 4662 4837 4900 5029 6449 6687 6751 8684 9936 11681 11811 11886 12089 12909 |
| 3 | 2418 3018 3647 4210 4473 7447 7502 9490 10067 11092 11139 11256 12201 12383 |
| 4 | 2591 2947 3349 3406 4417 4519 5176 6672 8498 8863 9201 11294 11376 12184 |
| 5 | 27 101 197 290 871 1727 3911 5411 6676 8701 9350 10310 10798 12439 |
| 6 | 1765 1897 2923 3584 3901 4048 6963 7054 7132 9165 10184 10824 11278 12669 |
| 7 | 2183 3740 4808 5217 5660 6375 6787 8219 8466 9037 10353 10583 11118 12762 |
| 8 | 73 1594 2146 2715 3501 3572 3639 3725 6959 7187 8406 10120 10507 10691 |
| 9 | 240 732 1215 2185 2788 2830 3499 3881 4197 4991 6425 7061 9756 10491 |
| 10 | 831 1568 1828 3424 4319 4516 4639 6018 9702 10203 10417 11240 11518 12458 |
| 11 | 2024 2970 3048 3638 3676 4152 5284 5779 5926 9426 9945 10873 11787 11837 |
| 12 | 1049 1218 1651 2328 3493 4363 5750 6483 7613 8782 9738 983 11744 11937 |
| 13 | 1193 2060 2289 2964 3478 4592 4756 6709 7162 8231 8326 11140 11908 12243 |
| 14 | 978 2120 2439 3338 3850 4589 6567 8745 9656 9708 10161 10542 10711 12639 |

TABLE 16-continued

| i | Indices of rows at which 1s are positioned in 0-th column of i-th column group |
|---|---|
| 15 | 2403 2938 3117 3247 3711 5593 5844 5932 7801 10152 10226 11498 12162 12941 |
| 16 | 1781 2229 2276 2533 3582 3951 5279 5774 793 9824 10920 11038 12340 12440 |
| 17 | 289 384 1980 2230 3464 3873 5958 8656 8942 9006 10175 11425 11745 12530 |
| 18 | 155 354 1090 1330 2002 2236 3559 3705 4922 5958 6576 8564 9972 12760 |
| 19 | 303 876 2059 2142 5244 5330 6644 7576 8614 9598 10410 10718 11033 12957 |
| 20 | 3449 3617 4408 4602 4727 6182 8835 8928 9372 9644 10237 10747 11655 12747 |
| 21 | 811 2565 2820 8677 8974 9632 11069 11548 11839 12107 12411 12695 12812 12890 |
| 22 | 972 4123 4943 6385 6449 7339 7477 8379 9177 9359 10074 11709 12552 12831 |
| 23 | 842 973 1541 2262 2905 5276 6758 7099 7894 8128 8325 8663 8875 10050 |
| 24 | 474 791 968 3902 4924 4965 5085 5908 6109 6329 7931 9038 9401 10568 |
| 25 | 1397 4461 4658 5911 6037 7127 7318 8678 8924 9000 9473 9602 10446 12692 |
| 26 | 1334 7571 12881 |
| 27 | 1393 1447 7972 |
| 28 | 633 1257 10597 |
| 29 | 4843 5102 11056 |
| 30 | 3294 8015 10513 |
| 31 | 1108 10374 10546 |
| 32 | 5353 7824 10111 |
| 33 | 3398 7674 8569 |
| 34 | 7719 9478 10503 |
| 35 | 2997 9418 9581 |
| 36 | 5777 6519 11229 |
| 37 | 1966 5214 9899 |
| 38 | 6 4088 5827 |
| 39 | 836 9248 9612 |
| 40 | 483 7229 7548 |
| 41 | 7865 8289 9804 |
| 42 | 2915 11098 11900 |
| 43 | 6180 7096 9481 |
| 44 | 1431 6786 8924 |
| 45 | 748 6757 8625 |
| 46 | 3312 4475 7204 |
| 47 | 1852 8958 11020 |
| 48 | 1915 2903 4006 |
| 49 | 6776 10886 12531 |
| 50 | 2594 9998 12742 |
| 51 | 159 2002 12079 |
| 52 | 853 3281 3762 |
| 53 | 5201 5798 6413 |
| 54 | 3882 6062 12047 |
| 55 | 4133 6775 9657 |
| 56 | 228 6874 11183 |
| 57 | 7433 10728 10864 |
| 58 | 7735 8073 12734 |
| 59 | 2844 4621 11779 |
| 60 | 3909 7103 12804 |
| 61 | 6002 9704 11060 |
| 62 | 5864 6856 7681 |
| 63 | 3652 5869 7605 |
| 64 | 2546 2657 4461 |
| 65 | 2423 4203 9111 |
| 66 | 244 1855 4691 |
| 67 | 1106 2178 6371 |
| 68 | 391 1617 10126 |
| 69 | 250 9259 10603 |
| 70 | 3435 4614 6924 |
| 71 | 1742 8045 9529 |
| 72 | 7667 8875 11451 |
| 73 | 4023 6108 6911 |
| 74 | 8621 10184 11650 |
| 75 | 6726 10861 12348 |
| 76 | 3228 6302 7388 |
| 77 | 1 1137 5358 |
| 78 | 381 2424 8537 |
| 79 | 3256 7508 10044 |
| 80 | 1980 2219 4569 |
| 81 | 2468 5699 10319 |
| 82 | 2803 3314 12808 |
| 83 | 8578 9642 11533 |
| 84 | 829 4585 7923 |
| 85 | 59 329 5575 |
| 86 | 1067 5709 6867 |
| 87 | 1175 4744 12219 |
| 88 | 109 2518 6756 |
| 89 | 2105 10626 11153 |
| 90 | 5192 10696 10749 |
| 91 | 6260 7641 8233 |
| 92 | 2998 3094 11214 |
| 93 | 3398 6466 11494 |
| 94 | 6574 10448 12160 |
| 95 | 2734 10755 12780 |
| 96 | 1028 7958 10825 |
| 97 | 8545 8602 10793 |
| 98 | 392 3398 11417 |
| 99 | 6639 9291 12571 |
| 100 | 1067 7919 8934 |
| 101 | 1064 2848 12753 |
| 102 | 6076 8656 12690 |
| 103 | 5504 6193 10171 |
| 104 | 1951 7156 7356 |
| 105 | 4389 4780 7889 |
| 106 | 526 4804 9141 |
| 107 | 1238 3648 10464 |
| 108 | 2587 5624 12557 |
| 109 | 5560 5903 11963 |
| 110 | 1134 2570 3297 |
| 111 | 10041 11583 12157 |
| 112 | 1263 9585 12912 |
| 113 | 3744 7898 10646 |
| 114 | 45 9074 10315 |
| 115 | 1051 6188 10038 |
| 116 | 2242 8394 12712 |
| 117 | 3598 9025 12651 |
| 118 | 2295 3540 5610 |
| 119 | 1914 4378 12423 |
| 120 | 1766 3635 12759 |
| 121 | 5177 9586 11143 |
| 122 | 943 3590 11649 |
| 123 | 4864 6905 10454 |
| 124 | 5852 6042 10421 |
| 125 | 6095 8285 12349 |
| 126 | 2070 7171 8563 |
| 127 | 718 12234 12716 |
| 128 | 512 10667 11353 |
| 129 | 3629 6485 7040 |
| 130 | 2880 8865 11466 |
| 131 | 4490 10220 11796 |
| 132 | 5440 8819 9103 |
| 133 | 5262 7543 12411 |
| 134 | 516 7779 10940 |
| 135 | 2515 5843 9202 |
| 136 | 4684 5994 10586 |
| 137 | 573 2270 3324 |
| 138 | 7870 8317 10322 |
| 139 | 6856 7638 12099 |
| 140 | 1583 7669 10781 |
| 141 | 8141 9085 12555 |
| 142 | 3903 5485 9992 |
| 143 | 4467 11998 12904 |

As another example of results designed in consideration of these additional conditions, if a codeword length $N_{ldpc}$ is 64800, a code rate R is 6/15, M is 360, and $Q_{ldpc}$ is 108, indices of a row at which one (1) is positioned in a zero (0)-th column of an i-th column group of a parity-check matrix having the structure of FIG. 3 are as shown in following Table 17.

TABLE 17

| i | Indices of rows at which 1s are positioned in 0-th column of i-th column group |
|---|---|
| 0 | 1606 3402 4961 6751 7132 11516 12300 12482 12592 13342 13764 14123 21576 23946 24533 25376 25667 26836 31799 34173 35462 36153 36740 37085 37152 37468 37658 |
| 1 | 4621 5007 6910 8732 9757 11508 13099 15513 16335 18052 19512 21319 23663 25628 27208 31333 32219 33003 33239 33447 36200 36473 36938 37201 37283 37495 38642 |
| 2 | 16 1094 2020 3080 4194 5098 5631 6877 7889 8237 9804 10067 11017 11366 13136 13354 15379 18934 20199 24522 26172 28666 30386 32714 36390 37015 37162 |
| 3 | 700 897 1708 6017 6490 7372 7825 9546 10398 16605 18561 18745 21625 22137 23693 24340 24966 25015 26995 28586 28895 29687 33938 34520 34858 37056 38297 |
| 4 | 159 2010 2573 3617 4452 4958 5556 5832 6481 8227 9924 10836 14954 15594 16623 18065 19249 22394 22677 23408 23731 24076 24776 27007 28222 30343 38371 |
| 5 | 3118 3545 4768 4992 5227 6732 8170 9397 10522 11508 15536 20218 21921 28599 29445 29758 29968 31014 32027 33685 34378 35867 36323 36728 36870 38335 38623 |
| 6 | 1264 4254 6936 9165 9486 9950 10861 11653 13697 13961 15164 15665 18444 19470 20313 21189 24371 26431 26999 28086 28251 29261 31981 34015 35850 36129 37186 |
| 7 | 111 1307 1628 2041 2524 5358 7988 8191 10322 11905 12919 14127 15515 15711 17061 19024 21195 22902 23727 24401 24608 25111 25228 27338 35398 37794 38196 |
| 8 | 961 3035 7174 7948 13355 13607 14971 18189 18339 18665 18875 19142 20615 21136 21309 21758 23366 24745 25849 25962 27583 30006 31118 32106 36469 36583 37920 |
| 9 | 2990 3549 4273 4808 5707 6021 6509 7456 8240 10044 12262 12660 13085 14750 15680 16049 21587 23997 25803 28343 28693 34393 34860 35490 36021 37737 38296 |
| 10 | 955 4323 5145 6885 8123 9730 11840 12216 19194 20313 23056 24248 24830 25268 26617 26801 28557 29753 30745 31450 31973 32839 33025 33296 35710 37366 37509 |
| 11 | 264 605 4181 4483 5156 7238 8863 10939 11251 12964 16254 17511 20017 22395 22818 23261 23422 24064 26329 27723 28186 30434 31956 33971 34372 36764 38123 |
| 12 | 520 2562 2794 3528 3860 4402 5676 6963 8655 9018 9783 11933 16336 17193 17320 19035 20606 23579 23769 24123 24966 27866 32457 34011 34499 36620 37526 |
| 13 | 10106 10637 10906 34242 |
| 14 | 1856 15100 19378 21848 |
| 15 | 943 11191 27806 29411 |
| 16 | 4575 6359 13629 19383 |
| 17 | 4476 4953 18782 24313 |
| 18 | 5441 6381 21840 35943 |
| 19 | 9638 9763 12546 30120 |
| 20 | 9587 10626 11047 25700 |
| 21 | 4088 15298 28768 35047 |
| 22 | 2332 6363 8782 28863 |
| 23 | 4625 4933 28298 30289 |
| 24 | 3541 4918 18257 31746 |
| 25 | 1221 25233 26757 34892 |
| 26 | 8150 16677 27934 30021 |
| 27 | 8500 25016 33043 38070 |
| 28 | 7374 10207 16189 35811 |
| 29 | 611 18480 20064 38261 |
| 30 | 25416 27352 36089 38469 |
| 31 | 1667 17614 25839 32776 |
| 32 | 4118 12481 21912 37945 |
| 33 | 5573 13222 23619 31271 |
| 34 | 18271 26251 27182 30587 |
| 35 | 14690 26430 26799 34355 |
| 36 | 13688 16040 20716 34558 |
| 37 | 2740 14957 23436 32540 |
| 38 | 3491 14365 14681 36858 |
| 39 | 4796 6238 25203 27854 |
| 40 | 1731 12816 17344 26025 |
| 41 | 19182 21662 23742 27872 |
| 42 | 6502 13641 17509 34713 |
| 43 | 12246 12372 16746 27452 |
| 44 | 1589 21528 30621 34003 |
| 45 | 12328 20515 30651 31432 |
| 46 | 3415 22656 23427 36395 |
| 47 | 632 5209 25958 31085 |
| 48 | 619 3690 19648 37778 |
| 49 | 9528 13581 26965 36447 |
| 50 | 2147 26249 26968 28776 |
| 51 | 15698 18209 30683 |
| 52 | 1132 19888 34111 |
| 53 | 4608 25513 38874 |
| 54 | 475 1729 34100 |
| 55 | 7348 32277 38587 |
| 56 | 182 16473 33082 |
| 57 | 3865 9678 21265 |
| 58 | 4447 20151 27618 |
| 59 | 6335 14371 38711 |
| 60 | 704 9695 28858 |
| 61 | 4856 9757 30546 |
| 62 | 1993 19361 30732 |
| 63 | 756 28000 29138 |
| 64 | 3821 24076 31813 |
| 65 | 4611 12326 32291 |
| 66 | 7628 21515 34995 |
| 67 | 1246 13294 30068 |
| 68 | 6466 33233 35865 |
| 69 | 14484 23274 38150 |
| 70 | 21269 36411 37450 |
| 71 | 23129 26195 37653 |

As another example of results designed in consideration of these additional conditions, if a codeword length $N_{ldpc}$ is 64800, a code rate R is 10/15, M is 360, and $Q_{ldpc}$ is 60, indices of a row at which one (1) is positioned in a zero (0)-th column of an i-th column group of a parity-check matrix having the structure of FIG. 3 are as shown in following Table 18.

TABLE 18

| i | Indices of rows at which 1s are positioned in 0-th column of i-th column group |
|---|---|
| 0 | 979 1423 4166 469 6341 8258 10334 10548 14098 14514 17051 17333 17653 17830 17990 |
| 1 | 2559 4025 6344 6510 9167 9728 11312 14856 17104 17721 18600 18791 19079 19697 19840 |
| 2 | 3243 6894 7950 10539 12042 13233 13938 14752 16449 16727 17025 18297 18796 19400 21577 |
| 3 | 3272 3574 6341 6722 9191 10807 10957 12531 14036 15580 16651 17007 17309 19415 19845 |
| 4 | 155 4598 10201 10975 11086 11296 12713 15364 15978 16395 17542 18164 18451 18612 20617 |
| 5 | 1128 1999 3926 4069 5558 6085 6337 8386 10693 12450 15438 16223 16370 17308 18634 |
| 6 | 2408 2929 3630 4357 5852 7329 8536 8695 10603 11003 14304 14937 15767 18402 21502 |
| 7 | 199 3066 6446 6849 8973 9536 10452 12857 13675 15913 16717 17654 19802 20115 21579 |
| 8 | 312 870 2095 2586 5517 6196 6757 7311 7368 13046 15384 18576 20349 21424 21587 |
| 9 | 985 1591 3248 359 3706 3847 6174 6276 7864 9033 13618 15675 16446 18355 18843 |
| 10 | 975 3774 4083 5825 6166 7218 7633 9657 10103 13052 14240 17320 18126 19544 20208 |
| 11 | 1795 2005 2544 3418 6148 8051 9066 9725 10676 10752 11512 15171 17523 20481 21059 |
| 12 | 167 315 1824 2325 2640 2868 6070 6597 7016 8109 9815 11608 16142 17912 19625 |
| 13 | 1298 1896 3039 4303 4690 8787 12241 13600 14478 15492 16602 17115 17913 19466 20597 |
| 14 | 568 3695 6045 6624 8131 8404 8590 9059 9246 11570 14336 18657 18941 19218 21506 |
| 15 | 228 1889 1967 2299 3011 5074 7044 7596 7689 9534 10244 10697 11691 17902 21410 |
| 16 | 1330 1579 1739 2234 3701 3865 5713 6677 7263 11172 12143 12765 17121 20011 21436 |
| 17 | 303 1668 2501 4925 5778 5985 9635 10140 10820 11779 11849 12058 15650 20426 20527 |

TABLE 18-continued

| i | Indices of rows at which 1s are positioned in 0-th column of i-th column group |
|---|---|
| 18 | 698 2484 3071 3219 4054 4125 5663 5939 6928 7086 8054 12173 16280 17945 19302 |
| 19 | 232 1619 3040 4901 7438 8135 9117 9233 10131 13321 17347 17436 18193 18586 19929 |
| 20 | 12 3721 6254 6609 7880 8139 10437 12262 13928 14065 14149 15032 15694 16264 18883 |
| 21 | 482 915 1548 1637 6687 9338 10163 11768 11970 15524 15695 17386 18787 19210 19340 |
| 22 | 1291 2500 4109 4511 5099 5194 10014 13165 13256 13972 15409 16113 16214 18584 20998 |
| 23 | 1761 4778 7444 7740 8129 8341 8931 9136 9207 10003 10678 13959 17673 18194 20990 |
| 24 | 3060 3522 5361 5692 6833 8342 8792 11023 11211 11548 11914 13987 15442 15541 19707 |
| 25 | 1322 2348 2970 5632 6349 7577 8782 9113 9267 9376 12042 12943 16680 16970 21321 |
| 26 | 6785 11960 21455 |
| 27 | 1223 15672 19550 |
| 28 | 5976 11335 20385 |
| 29 | 2818 9387 15317 |
| 30 | 2763 3554 18102 |
| 31 | 5230 11489 18997 |
| 32 | 5809 15779 20674 |
| 33 | 2620 17838 18533 |
| 34 | 3025 9342 9931 |
| 35 | 3728 5337 12142 |
| 36 | 2520 6666 9164 |
| 37 | 12892 15307 20912 |
| 38 | 10736 12393 16539 |
| 39 | 1075 2407 12853 |
| 40 | 4921 5411 18206 |
| 41 | 5955 15647 16838 |
| 42 | 6384 10336 19266 |
| 43 | 429 10421 17266 |
| 44 | 4880 10431 12208 |
| 45 | 2910 11895 12442 |
| 46 | 7366 18362 18772 |
| 47 | 4341 7903 14994 |
| 48 | 4564 6714 7378 |
| 49 | 4639 8652 18871 |
| 50 | 15787 18048 20246 |
| 51 | 3241 11079 13640 |
| 52 | 1559 2936 15881 |
| 53 | 2737 6349 10881 |
| 54 | 10394 16107 17073 |
| 55 | 8207 9043 12874 |
| 56 | 7805 16058 17905 |
| 57 | 11189 15767 17764 |
| 58 | 5823 12923 14316 |
| 59 | 11080 20390 20924 |
| 60 | 568 8263 17411 |
| 61 | 1845 3557 6562 |
| 62 | 2890 10936 14756 |
| 63 | 9031 14220 21517 |
| 64 | 3529 12955 15902 |
| 65 | 413 6750 8735 |
| 66 | 6784 12092 16421 |
| 67 | 12019 13794 15308 |
| 68 | 12588 15378 17676 |
| 69 | 8067 14589 19304 |
| 70 | 1244 5877 6085 |
| 71 | 15897 19349 19993 |
| 72 | 1426 2394 12264 |
| 73 | 3456 8931 12075 |
| 74 | 13342 15273 20351 |
| 75 | 9138 13352 20798 |
| 76 | 7031 7626 14081 |
| 77 | 4280 4507 15617 |
| 78 | 4170 10569 14335 |
| 79 | 3839 7514 16578 |
| 80 | 4688 12815 18782 |
| 81 | 4861 7858 9435 |
| 82 | 605 5445 12912 |
| 83 | 2280 4734 7311 |
| 84 | 6668 8128 12638 |
| 85 | 3733 10621 19534 |
| 86 | 13933 18316 19341 |
| 87 | 1786 3037 21566 |
| 88 | 2202 13239 16432 |
| 89 | 4882 5808 9300 |
| 90 | 4580 8484 16754 |
| 91 | 14630 17502 18269 |
| 92 | 6889 11119 12447 |
| 93 | 8162 9078 16330 |
| 94 | 6538 17851 18100 |
| 95 | 17763 19793 20816 |
| 96 | 2183 11907 17567 |
| 97 | 6640 14428 15175 |
| 98 | 877 12035 14081 |
| 99 | 1336 6468 12328 |
| 100 | 5948 9146 12003 |
| 101 | 3782 5699 12445 |
| 102 | 1770 7946 8244 |
| 103 | 7384 12639 14989 |
| 104 | 1469 11586 20959 |
| 105 | 7943 10450 15907 |
| 106 | 5005 8153 10035 |
| 107 | 17750 18826 21513 |
| 108 | 4725 8041 10112 |
| 109 | 3837 16266 17376 |
| 110 | 11340 17361 17512 |
| 111 | 1269 4611 4774 |
| 112 | 2322 10813 16157 |
| 113 | 16752 16843 18959 |
| 114 | 70 4325 18753 |
| 115 | 3165 8153 15384 |
| 116 | 160 8045 16823 |
| 117 | 14112 16724 16792 |
| 118 | 4291 7667 18176 |
| 119 | 5943 19879 20721 |

Here, it is to be noted that even if the parity-check matrix in which an order of indices within a sequence for each i-th column group in any of above Tables 9 to 18 is changed, the changed parity-check matrix may also be applied to the same codes to which the original parity-check matrix applies.

For example, as shown in above Table 11, the sequence corresponding to the zero (0)-th column group is arranged in an order of 114, 2135, 3045, 4635, 5512, 5681, 6571, 8943, 10053, 10109, 13161, 13668, 14218, 17417, 19328, 21140, and even if the sequence has a changed index order like 2135, 8943, 4635, 114, 3045, 10109, 13161, 21140, 5681, 6571, 5512, 19328, 14218, 13668, 17417, 10053, a parity-check matrix having the changed sequence may be used for the same codes.

In addition, even if one index sequence of one column group is changed to an index sequence of another column group and vice versa, that is, an index sequence of the other column group is changed to the index sequence of the first column group, in above Tables 9 to 18, algebraic characteristics such as the cycle characteristics and the degree distributions on a graph of codes are not changed. Therefore, this case of changing index sequences between column groups of a parity-check matrix is another exemplary embodiment of the inventive concept.

For example, in above Table 11, the index sequence 114, 2135, 3045, 4635, 5512, 5681, 6571, 8943, 10053, 10109, 13161, 13668, 14218, 17417, 19328, 21140 of the zero (0)-th column group and the index sequence 19, 768, 1263, 3305, 6513, 7677, 7956, 9040, 13427, 16641, 17280, 18452, 18584, 18925, 19559, 20587 of a twelfth column group can be changed to set the sequence of the zero (0)-th column group to be 19, 768, 1263, 3305, 6513, 7677, 7956, 9040, 13427, 16641, 17280, 18452, 18584, 18925, 19559, 20587, and the sequence of the twelfth column group is set to be 114, 2135, 3045, 4635, 5512, 5681, 6571, 8943, 10053, 10109, 13161, 13668, 14218, 17417, 19328, 21140. That is, even if the index sequences are exchanged between the zero (0)-th column group and the twelfth column group, the cycle characteristics, the degree distributions, and the like in terms of the graph of codes are not changed (actually, since exchanging the index sequences between corresponding column groups is the same as changing only the arranging order of column groups within a parity-check matrix, the main algebraic characteristics are not changed).

In addition, a parity-check matrix in which an integer multiple of $Q_{ldpc}$ is added to all indices of any column group in above Tables 9 to 18 may also result in the same algebraic characteristics such as the cycle characteristics and the degree distributions on the graph of the codes, according to an exemplary embodiment.

For example, if a multiple of 60 (that is, $Q_{ldpc}=(N_{ldpc}-K_{ldpc})/M=60$) is added to all indices 12575, 15845 and 18200 of a twenty-fourth column group in above Table 11, that is, the indices are changed to 12635 (=12575+60), 15905 (=15845+60), and 18260 (=18200+60), the algebraic characteristics such as the cycle characteristics and the degree distributions on the graph of codes are not changed (actually, since a sequence obtained by adding an integer multiple of $Q_{ldpc}$ in a column group has the same effect as rearranging only the order of columns within the column group, the main algebraic characteristics are not changed).

Here, it is to be noted that in the case in which an index value obtained by adding an integer multiple of $Q_{ldpc}$ to a given index sequence is a value of $N_{ldpc}-K_{ldpc}$ or more, the index value is changed and applied to a value obtained by performing a modulo operation on $N_{ldpc}-K_{ldpc}$.

For example, since a result of adding only 60×60 to the sequence 12575, 15845 and 18200 of the twenty-fourth column group in above Table 11 becomes 16175, 19445 and 21800 while $N_{ldpc}-K_{ldpc}=21600$, the changed sequence may be 16175, 19445 and 200 or 200, 16175 and 19445 by applying modulo-21600 to a result of adding only the integer multiple of $Q_{ldpc}$ to the given sequence.

Hereinafter, a process of encoding LDPC codes using a parity-check matrix having the structure as illustrated in FIG. 3 will be described. As described above, the process of encoding LDPC codes is to determine a codeword C meeting a relational equation: parity-check matrix×codeword=0. That is, the process of encoding LDPC codes may be represented by $H \cdot C^T=0$. Here, H is the parity-check matrix and C represents the LDPC codeword.

Hereinafter, if it is assumed that LDPC encoded information word bits are word $(i_0, i_1, i_2, \ldots, i_{K_{ldpc}-1})$ and the LDPC codeword bits generated by the LDPC encoding are $(c_0, c_1, \ldots, c_{N_{ldpc}-1})$, a method for calculating LDPC codeword bits will be described.

First, since the LDPC code is a systematic code, $c_k$ for $0 \le k < K_{ldpc}-1$) is set to be the same as $i_k$. In addition, the remaining codeword bits are set to be $p_k := c_{k+K_{ldpc}}$. Here, $p_k$ is parity bits and may be calculated as described below.

Meanwhile, according to an exemplary embodiment, since the parity-check matrix is defined by in above Tables 9 to 18, a process to be described below may be applied in the case in which the parity-check matrix is defined by in above Tables 9 to 18.

First, if it is assumed that an entry notated in a j-th position of an i-th row in above Tables 9 to 18 is $q(i, j, 1)=q(i, j, 0)+Q_{ldpc} \cdot 1 (\bmod N_{ldpc}-K_{ldpc})$ for $0 \le l < 360$. Here, accumulation '+' means additions defined in a Galois field (GF) (2) (that is, additions in GF (2)). In addition, $Q_{ldpc}$, which is a size of each column cyclically shifted in an information word sub-matrix, may be a value defined in above Tables 9 to 18, respectively.

Meanwhile, when $q(i, j, 0)$ and $q(i, j, 1)$ are defined as described above, a process of calculating parity bits is as follows.

Step 1) The parity bits are initialized to '0'. That is, $p_k=0$ for $0 \le k < N_{ldpc}-K_{ldpc}$.

Step 2) i and l are set to be and l:=k (mod 360) for all k values of $0 \le k < K_{ldpc}$. Here, $\lfloor x \rfloor$ is the largest integer value among integers that are not larger than x. That is, $\lfloor 1,2 \rfloor =1$. Next, $i_k$ is added to $p_{q(i,j,1)}$ for all js as following based on the set i and l values. That is, $p_{q(i,0,1)}=p_{q(i,0,1)}+i_k$, $p_{q(i,1,1)}=p_{q(i,1,1)}+i_k$, $p_{q(i,2,1)}=p_{q(i,2,1)}+i_k$, $\ldots$, $p_{q(i,w(i)-1,1)}=p_{q(i,w(i)-1,1)}+i_k$ are calculated.

Here, w (i) is the number of values of the i-th row in above Tables 9 to 18 and represents the number of ones (1s) in a column corresponding to $i_k$ in the parity-check matrix. In addition, q (i, j, 0), which is the entry notated in the j-th position of the i-th row in above Tables 9 to 18, is an index of the parity bit and represents a position of a row at which one (1) is positioned in a column corresponding to $i_k$ in the parity-check matrix.

Step 3) $p_k=p_k+p_{k-1}$ is calculated for all ks meeting $0 < k < N_{ldpc}-K_{ldpc}$ to calculate the parity bits $p_k$.

The parity bits are calculated by the foregoing method, such that all the LDPC codeword bits $c_0, c_1, \ldots, c_{N_{ldpc}-1}$ may be calculated.

Meanwhile, the LDPC encoding process as described above is only an example. That is, since the LDPC encoding process is a process of calculating an LDPC codeword C satisfying $H \cdot C^T=0$, various encoding methods for the given parity-check matrix may be present.

For example, a scheme applied in the DVB-T2 standard may also be applied to the case in which the parity-check matrix is defined by above Tables 9 to 18. Hereinafter, the LDPC encoding process according to the scheme described in the DVB-T2 standard will be schematically described using an example in which the parity-check matrix is defined in above Table 11.

First, if it is assumed that information word bits having a length of $K_{ldpc}$ are $[i_0, i_1, i_2, \ldots, i_{K_{ldpc}-1}]$ and parity bits having a length of $N_{ldpc}-K_{ldpc}$ are $[p_0, p_1, p_2, \ldots, p_{N_{ldpc}-K_{ldpc}-1}]$, the LDPC encoding may be performed by the following process.

Step 1) The parity bits are initialized to '0'. That is, $p_0=p_1=p_2=\cdots=p_{N_{ldpc}-K_{ldpc}-1}=0$.

Step 2) A zero (0)-th information word bit $i_0$ is accumulated in a parity bit which has an address of a parity bit defined in a first row (that is, a row of i=0) of above Table 11 as the index of the parity bit. This may be represented by following mathematical expressions 11.

$$\begin{aligned}
p_{114} &= p_{114} \oplus i_0 & p_{10053} &= p_{10053} \oplus i_0 \\
p_{2135} &= p_{2135} \oplus i_0 & p_{10109} &= p_{10109} \oplus i_0 \\
p_{3045} &= p_{3045} \oplus i_0 & p_{13161} &= p_{13161} \oplus i_0 \\
p_{4635} &= p_{4635} \oplus i_0 & p_{13668} &= p_{13668} \oplus i_0 \\
p_{5512} &= p_{5512} \oplus i_0 & p_{14218} &= p_{14218} \oplus i_0 \\
p_{5681} &= p_{5681} \oplus i_0 & p_{17417} &= p_{17417} \oplus i_0 \\
p_{6571} &= p_{6571} \oplus i_0 & p_{19328} &= p_{19328} \oplus i_0 \\
p_{8943} &= p_{8943} \oplus i_0 & p_{21140} &= p_{21140} \oplus i_0
\end{aligned} \quad (11)$$

In the above mathematical expressions, $i_0$ represents a zero (0)-th information word bit, p, represents an i-th parity bit, and ⊕ represents a binary operation. According to the binary operation, $_1⊕_1$ is 0, $_1⊕_0$ is 1, $_0⊕_1$ is 1, and $_0⊕_0$ is 0.

Step 3) The remaining 359 information word bits $i_m$ (m=1, 2, ..., 359) are accumulated in the parity bits. Here, the remaining information word bits may be information word bits which belong to the same column group as a column group to which $i_0$ belongs. In this case, the addresses of the parity bits may be determined based on following mathematical expression 12.

$$(x+(m \bmod 360) \times Q_{ldpc}) \bmod (N_{ldpc}-K_{ldpc}) \qquad (12)$$

In above mathematical expression 12, x is an address of a parity bit accumulator corresponding to the information word bit $i_0$, and $Q_{ldpc}$ is 60 as a size of each column which is shifted in a sub-matrix corresponding to the information word.

As a result, each of the information word bits $i_m$ (m=1, 2, ..., 359) is accumulated in each parity bit having the addresses of the parity bits calculated based on above mathematical expression 12 as indices. As an example, operations as represented by following mathematical expression 13s may be performed on the information word bit $i_1$.

$$\begin{aligned}
p_{174} &= p_{174} \oplus i_1 & p_{10113} &= p_{10113} \oplus i_1 \\
p_{2195} &= p_{2195} \oplus i_1 & p_{10609} &= p_{10169} \oplus i_1 \\
p_{3105} &= p_{3105} \oplus i_1 & p_{13221} &= p_{13221} \oplus i_1 \\
p_{4695} &= p_{4695} \oplus i_1 & p_{13728} &= p_{13728} \oplus i_1 \\
p_{5572} &= p_{5572} \oplus i_1 & p_{14278} &= p_{14728} \oplus i_1 \\
p_{5741} &= p_{5741} \oplus i_1 & p_{17477} &= p_{17477} \oplus i_1 \\
p_{6631} &= p_{6631} \oplus i_1 & p_{19388} &= p_{19388} \oplus i_1 \\
p_{9003} &= p_{9003} \oplus i_1 & p_{21200} &= p_{21200} \oplus i_1
\end{aligned} \qquad (13)$$

In above mathematical expression, $i_t$ represents a 1-th information word bit, $p_1$ represents an i-th parity bit, and ⊕ represents a binary operation. According to the binary operation, $_1⊕_1$ is 0, $_1⊕_0$ is 1, $_0⊕_1$ is 1, and $_0⊕_0$ is 0.

Step 4) A 360-th information word bit $i_{360}$ is accumulated in a parity bit which has an address of a parity bit defined in a second row (that is, a row of i=1) of above Table 11 as the index of the parity bit.

Step 5) The remaining 359 information word bits belonging to the same group as a group to which the information word bit $i_{360}$ belongs are accumulated in the parity bit. In this case, the address of the parity bit may be determined based on above mathematical expression 6. However, in this case, x is an address of a parity bit accumulator corresponding to the information word bit $i_{360}$.

Step 6) the foregoing processes of Step 4 and Step 5 are repeated for all of the column groups of above Table 5.

Step 7) As a result, the parity bit $p_1$ is calculated based on following mathematical expression 14. Here, i is initialized to one (1).

$$p_i = p_i \oplus p_{i-1} \, i=1,2,\ldots,N_{ldpc}-K_{ldpc}-1 \qquad (14)$$

In above mathematical expression 14, $p_1$ represents an i-th parity bit, $N_{ldpc}$ represents the LDPC codeword length, $K_{ldpc}$ represents the information word length in the LDPC codeword, and ⊕ represents a binary operation. According to the binary operation, $_1⊕_1$ is 0, $_1⊕_0$ is 1, $_0⊕_1$ is 1, and $_0⊕_0$ is 0.

According to the above method, the parity bits may be calculated.

Meanwhile, the addresses of the parity bit present in the zero (0)-th column of the i-th column group are the same as the indices of the row at which one (1) is positioned in the zero (0)-th column of the i-th column group. Therefore, the indices of the row at which one (1) is positioned in the zero (0)-th column of the i-th column group in above Tables 9 to 18 are represented as addresses of the parity bits in the encoding process. Therefore, above Tables 9 to 18 may show "addresses of parity bit accumulators".

As described above, according to the above exemplary embodiments, the LDPC encoding process may be performed using various schemes to generate an LDPC codeword.

Meanwhile, LDPC codes may be decoded using an iterative decoding algorithm based on the sum-product algorithm on the bipartite graph illustrated in FIG. 2, in which the sum-product algorithm is a kind of message passing algorithm.

Hereinafter, a message passing operation generally used for LDPC decoding will be described with reference to FIGS. 5A and 5B.

Figure 5A:
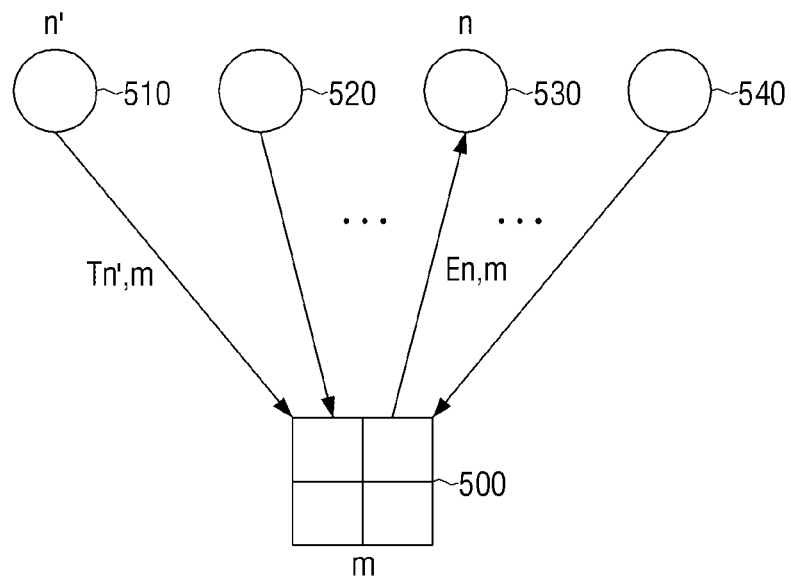
FIGS. 5A and 5B are diagrams illustrating a check node and a variable node used for LDPC decoding, according to exemplary embodiments.
Figure 5B:
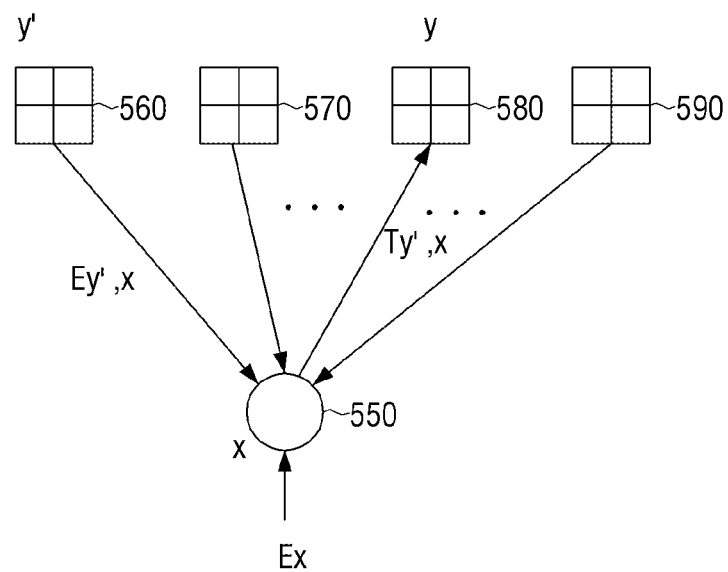

FIGS. 5A and 5B illustrate a message passing operation in any check node and variable node for LDPC decoding, according to an exemplary embodiment.

FIG. 5A illustrates a check node m 500 and a plurality of variable nodes 510, 520, 530 and 540 connected to the check node m 500. In addition, $T_{n',\,m}$ illustrated in FIG. 5A indicates a message passing from the variable node n' 510 to the check node m 500, and $E_{n',\,m}$ indicates a message passing from the check node m 500 to the variable node n 530. Here, a set of all variable nodes connected to the check node m 500 is defined by N (m), and a set except the variable node n 530 in the N (m) is defined by N (m) \ n.

In this case, a message update rule based on the sum-product algorithm may be represented by following mathematical expressions 15.

$$|E_{n,m}| = \Phi\left[\sum_{n' \in N(m) \backslash n} \Phi(|T_{n',m}|)\right] \qquad (15)$$

$$\mathrm{Sign}(E_{n,m}) = \prod_{n' \in N(m) \backslash n} \mathrm{sign}(T_{n',m})$$

In above mathematical expressions 15, Sign ($E_{n,\,m}$) indicates a sign of the message $E_{n,\,m}$, and $E_{n,\,m}$ indicates a magnitude of the message $E_{n,\,m}$ Meanwhile, a function $\Phi(x)$ may be represented by following mathematical expression 16.

$$\Phi(x) = -\log\left(\tanh\left(\frac{x}{2}\right)\right) \qquad (16)$$

FIG. 5B illustrates a variable node x 550 and a plurality of check nodes 560, 570, 580 and 590 connected to the variable node x 550. In addition, $E_{y',\,x}$ illustrated in FIG. 5B indicates a message passing from the check node y' 560 to the variable node x 550, and $T_{y,\,x}$ indicates a message passing from the variable node x 550 to the variable node y 580. Here, a set of all variable nodes connected to the variable node x 550 is defined by M (x), and a set except the check node y 580 in M (x) is defined by M (x) \ y. In this case, the message update rule based on the sum-product algorithm may be represented by following mathematical expression 17.

$$T_{y,x} = E_x + \Sigma_{y, \in M(x)/y} E_{y'x} \qquad (17)$$

In above mathematical expression 17, $E_x$ represents an initial message value of the variable node x.

In addition, when a bit value of the node x is decided, it may be represented by following mathematical expression 18.

$$P_x = E_x + \Sigma_{y' \in M(x)} E_{y'x} \quad (18)$$

In this case, an encoding bit corresponding to the node x may be decided depending on a value of $P_x$.

In FIG. 5, the foregoing method is a general decoding method, and thus, the detailed description thereof will be omitted. However, in addition to the method described with reference to FIG. 5, other methods for determining the passing message values at the variable node and the check node may also be applied (Frank R. Kschischang, Brendan J. Frey, and Hans-Andrea Loeliger, "Factor Graphs and the Sum-Product Algorithm," IEEE TRANSACTIONS ON INFORMATION THEORY, VOL. 47, NO. 2, FEBRUARY 2001, pp 498-519).

Figure 6:
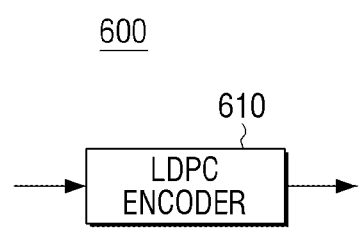
FIG. 6 is a block diagram for describing a configuration of an encoding apparatus, according to an exemplary embodiment.

FIG. 6 is a block diagram illustrating a configuration of an encoding apparatus according to an exemplary embodiment. The encoding apparatus 600 may perform the LDPC encoding described above.

As illustrated in FIG. 6, the encoding apparatus 600 includes an LDPC encoder 610. The LDPC encoder 610 may perform the LDPC encoding on input bits based on the parity-check matrix generated in the above method to generate an LDPC codeword. The LDPC codeword may be formed of 64800 bits. That is, the LDPC codeword length may be 64800.

Here, the parity-check matrix may have the same structure as that of the parity-check matrix 300 illustrated in FIG. 3.

In detail, the parity-check matrix includes the information word sub-matrix and the parity sub-matrix described above.

Here, the information word sub-matrix is formed of a plurality of column groups each including M columns and may be defined by a table indicating positions of value one (1) present in every M-th column. Here, M, which is an interval at which patterns of columns are repeated in the information word sub-matrix, may be 360. In addition, the parity sub-matrix may have a dual diagonal structure.

In this case, the LDPC encoder 610 may perform the LDPC encoding using parity-check matrices differently defined depending on a code rate (that is, a code rate of the LDPC codes).

For example, the LDPC encoder 610 may perform the LDPC encoding using parity-check matrices defined by a table such as above Tables 9, 13 and 17 when the code rate is 6/15, and perform the LDPC encoding using parity-check matrices defined by a table such as above Tables 10 and 14 when the code rate is 8/15. Further, the LDPC encoder 610 may perform the LDPC encoding using parity-check matrices defined by a table such as above Tables 11, 15 and 18 when the code rate is 10/15, and perform the LDPC encoding using parity-check matrices defined by a table such as above Tables 12 and 16 when the code rate is 12/15.

Meanwhile, a detailed method for performing the LDPC encoding is already described, and thus, duplicate descriptions thereof will be omitted.

The encoding apparatus 600 may further include a memory (not illustrated) in which information on a code rate, a codeword length and a parity-check matrix of an LDPC code is previously stored, and the LDPC encoder 610 may perform LDPC encoding using this information. Here, the information on the parity-check matrix may comprise information about an information word sub-matrix which is formed of a plurality of column groups each including M columns and a table showing positions of value one (1) present in every M-th column.

Figure 7:
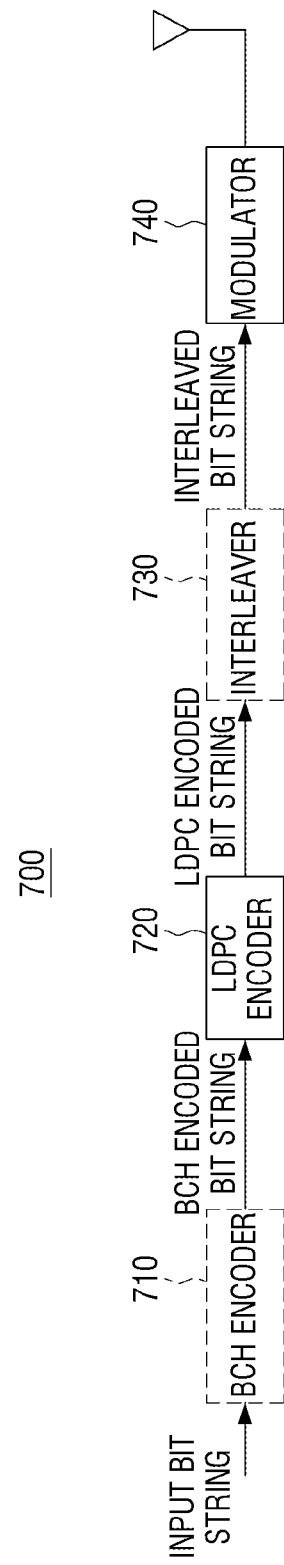
FIG. 7 is a block diagram for describing a configuration of a transmitting apparatus, according to an exemplary embodiment.

FIG. 7 is a block diagram showing a configuration of a transmitting apparatus according to an exemplary embodiment. As illustrated in FIG. 7, a transmitting apparatus 700 may include a Bose, Chaudhuri, Hocquenghem (BCH) encoder 710, an LDPC encoder 720, an interleaver 730, and a modulator 740.

The BCH encoder 710 performs BCH encoding on input bits and outputs a BCH codeword generated by BCH encoding to the LDPC encoder 720.

In detail, the BCH encoder 710 performs the BCH encoding on the input bits $L = [l_0, l_1, \ldots, l_{K_{bch}-1}]$, to generate $N_{ldpc} - K_{bch}$ BCH parity bits and generate an BCH codeword $I_{ldpc} = [i_0, i_1, i_2, \ldots, i_{K_{ldpc}-1}]$. The BCH codeword $l_{ldpc} = [i_0, i_1, i_2, \ldots, i_{K_{ldpc}-1}]$ is an information word for LDPC encoding, to the LDPC encoder 720.

The BCH encoding is a well-known technology and is disclosed in "Bose, R. C.; Ray-Chaudhuri, D. K. (March 1960), "On A Class of Error Correcting Binary Group Codes", Information and Control 3 (1): 68-79, ISSN 0890-5401", etc., and thus, detailed descriptions thereof will be omitted herein.

Meanwhile, it may be changed whether the BCH encoder 710 is used. That is, in some cases, the BCH encoder 710 may also be omitted.

The LDPC encoder 720 performs LDPC encoding on the BCH codeword output from the BCH encoder 710 and outputs an LDPC codeword generated by the LDPC encoding to the interleaver 730.

In detail, the LDPC encoder 720 performs the LDPC encoding on the BCH codeword $I_{ldpc} = [i_0, i_1, i_2, \ldots, i_{K_{ldpc}-1}]$ output from the BCH encoder 710 as the information word to generate $N_{ldpc} - K_{ldpc}$ LDPC parity bits and generate the LDPC codeword $c_{ldpc} = [c_0, c_1, \ldots, c_{N_{ldpc}-1}]$ However, when the BCH encoder 710 is omitted, the LDPC encoder 720 may perform the LDPC encoding on the input bits.

Meanwhile, the LDPC encoder 720 of FIG. 7 may be implemented as the LDPC encoder 610 described with reference to FIG. 6. That is, the LDPC encoder 720 may perform the LDPC encoding using the parity-check matrix in which the information word sub-matrix is defined by above Tables 9 to 18 depending on the code rate and the parity sub-matrix has the dual diagonal structure.

To this end, the transmitting apparatus 700 may include a memory (not illustrated) for storing the information on the parity-check matrix. In this case, the parity-check matrix may be various depending on the code rate and may be the table defined by above Tables 9 to 18 as an example. Here, the information on the parity-check matrix may comprise the information regarding information word sub-matrix which is formed of the plurality of column groups each including M columns and a table showing positions of value one (1) present in every M-th column.

The interleaver 730 performs interleaving on the LDPC codeword output from the LDPC encoder 720 and outputs the interleaved bits to the modulator 740.

In this case, the interleaver 730 receives an LDPC codeword bit string output from the LDPC encoder 720 to perform the interleaving using a predetermined scheme. The interleaving scheme may be variously present and it may be variable whether or not the interleaver 730 is used.

Figure 10:
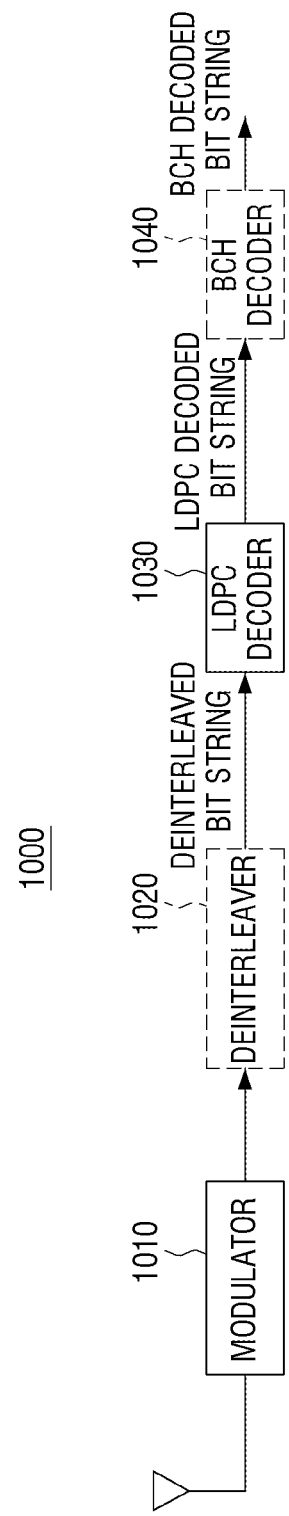
FIG. 10 is a block diagram for describing a configuration of a receiving apparatus, according to an exemplary embodiment.

The modulator 740 modulates the bit string output from the interleaver 730 and transmits the modulated bit string to a receiving apparatus (for example, 1000 of FIG. 10).

In detail, the modulator 740 may demultiplex bits output from the interleaver 730 and map the demultiplexed bits to constellation.

That is, the modulator 740 may convert the bits output from the interleaver 730 in a serial-to-parallel scheme to generate cells formed of a predetermined number of bits. Here, the number of bits forming each cell may be equal to the number of bits forming modulation symbols which are mapped to the constellation.

Next, the modulator 740 may map the demultiplexed bits to the constellation. That is, the modulator 740 modulates the demultiplexed bits using various modulation schemes such as QPSK, 16-QAM, 64-QAM, 256-QAM, 1024-QAM, and 4096-QAM to generate the modulation symbols, and map the generated modulation symbols to constellation points. In this case, the demultiplexed bits are formed of the cells corresponding to the modulation symbols, and thus, each cell may sequentially be mapped to the constellation points.

Further, the modulator 740 may modulate signals mapped to the constellation and transmit the modulated signals to the receiving apparatus 1000. For example, the modulator 740 may map the signals, which are mapped to the constellation, to an OFDM frame by using an orthogonal frequency division multiplexing (OFDM) scheme and transmit the mapped signals to the receiving apparatus 1000 through an allocated channel.

The transmitting apparatus 700 may pre-store various parameters which are used for encoding, interleaving, and modulation. Here, the parameters used for encoding may be information on the code rate and the codeword length of the BCH codes and the information on the code rate, the codeword length, and the parity-check matrix of the LDPC codes. Further, the parameters used for interleaving may be information on an interleaving rule and the parameter used for modulation may be information on the modulation schemes. Here, the information on the parity-check matrix may comprise the information regarding information word sub-matrix which is formed of the plurality of column groups each including M columns and a table showing positions of value one (1) present in every M-th column.

In this case, each component configuring the transmitting apparatus 700 may be operated using the parameters.

Meanwhile, although not illustrated, the transmitting apparatus 700 may further include a controller (not illustrated) for controlling an operation of the transmitting apparatus 700.

In this case, the controller (not illustrated) may provide the information on the code rate and the codeword length of the BCH codes to the BCH encoder 710 and provide the information on the code rate, the codeword length, the parity-check matrix of the LDPC codes to the LDPC encoder 720. Further, the controller (not illustrated) may provide the information on the interleaving schemes to the interleaver 730 and the information on the modulation schemes to the modulator 740. Here, the information on the parity-check matrix may comprise the information regarding information word sub-matrix which is formed of the plurality of column groups each including M columns and a table showing positions of value one (1) present in every M-th column.

Figure 8:
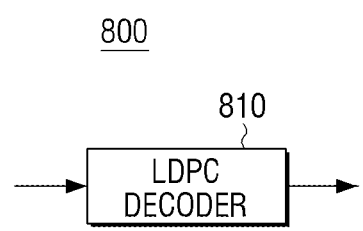
FIG. 8 is a block diagram for describing a configuration of a decoding apparatus, according to an exemplary embodiment.

FIG. 8 is a block diagram illustrating a configuration of a decoding apparatus according to an exemplary embodiment. As illustrated in FIG. 8, a decoding apparatus 800 includes an LDPC decoder 810.

The LDPC decoder 810 performs LDPC decoding on an LDPC codeword based on a parity-check matrix. Here, the LDPC codeword may be formed of 64800 bits. That is, the LDPC codeword length may be 64800.

For example, the LDPC decoder 810 passes log likelihood ratio (LLR) values corresponding to the LDPC codeword bits using an iterative decoding algorithm to perform the LDPC decoding, thereby generating information word bits.

Here, the LLR values may be represented by channel values corresponding to the LDPC codeword bits by various methods.

For example, the LLR values may be represented by values obtained by taking a log on a ratio of a probability that bits transmitted through the channel at the transmitting side are zero (0) and a probability that bits are one (1). Further, the LLR values may be bit values determined by a soft decision and may also be a representative value determined depending on a section to which the probability that the bits transmitted from the transmitting side are zero (0) or one (1) belongs.

In this case, the transmitting side may use the LDPC encoder 610 as illustrated in FIG. 6 to generate the LDPC codeword.

Meanwhile, the parity-check matrix used for the LDPC decoding may have the same form as that of the parity-check matrix 300 illustrated in FIG. 3.

In detail, the parity-check matrix includes the information word sub-matrix and the parity sub-matrix.

Here, the information word sub-matrix is formed of a plurality of column groups each including M columns and is defined by the table indicating positions of value one (1) present in every M-th column. Here, M, which is an interval at which patterns of columns are repeated in the information word sub-matrix, may be 360. In addition, the parity sub-matrix may have a dual diagonal structure.

In this case, the LDPC decoder 810 may perform the LDPC decoding using the parity-check matrices differently defined depending on a code rate (that is, a code rate of LDPC codes).

For example, the LDPC decoder 810 may perform the LDPC decoding using parity-check matrices defined by a table such as above Tables 9, 13 and 17 when the code rate is 6/15, and perform the LDPC decoding using parity-check matrices defined by a table such as above Tables 10 and 14 when the code rate is 8/15. Further, the LDPC decoder 810 may perform the LDPC decoding using parity-check matrices defined by a table such as above Tables 11, 15 and 18 when the code rate is 10/15 and perform the LDPC decoding using parity-check matrices defined by a table such as above Tables 12 and 16 when the code rate is 12/15.

Figure 9:
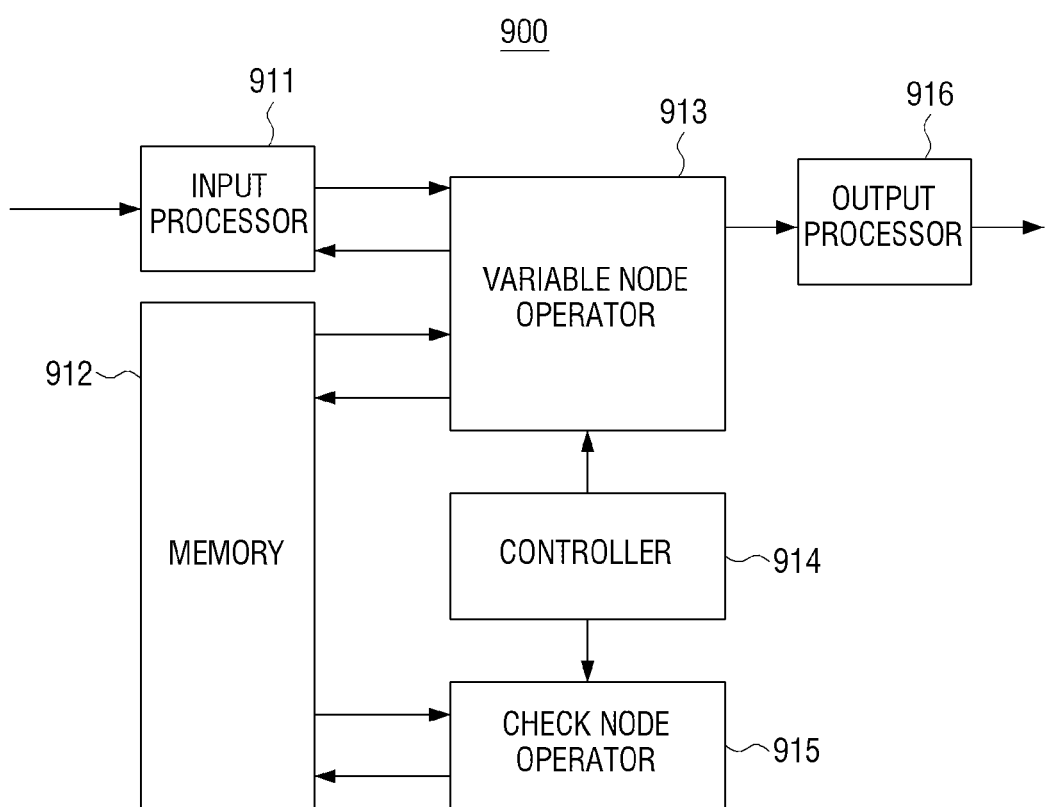
FIG. 9 is a block diagram for describing a decoding apparatus, according to an exemplary embodiment.

As described above, the LDPC decoder 810 may perform the LDPC decoding using an iterative decoding algorithm. In this case, the LDPC decoder 810 may be configured as illustrated in FIG. 9. However, the iterative decoding algorithm is already known, and thus, the detailed configuration illustrated in FIG. 9 is only one example.

As illustrated in FIG. 9, a decoding apparatus 900 includes an input processor 911, a memory 912, a variable node operator 913, a controller 914, a check node operator 915 and an output processor 916.

The input processor 911 stores an input value. In detail, the input processor 911 may store the LLR values of signals received through a wireless channel.

The controller 914 determines the number of values input to the variable node operator 913, an address value in the memory 912, the number of values input to the check node operator 915, an address value in the memory 912, and the like, based on a size (that is, a codeword length) of a block of the signal received through the wireless channel and a parity-check matrix corresponding to the code rate.

According to the exemplary embodiment, indices of a row at which one (1) is positioned in a zero (0)-th column of an i-th column group may perform the decoding based on the parity-check matrices defined by above Tables 9 to 18.

The memory 912 stores the input data and output data of the variable node operator 913 and the check node operator 915.

The variable node operator 913 receives data from the memory 912 based on information on the address of the input data and information on the number of input data which are received from the controller 914 to perform a variable node operation. Next, the variable node operator 913 stores variable node operation results in the memory 912 based on information on the address of the output data and information on the number of output data which are received from the controller 914. Further, the variable node operator 913 inputs the variable node operation results to the output processor 916 based on data which are received from the input processor 911 and the memory 912. Here, the variable node operation is already described with reference to FIG. 5.

The check node operator 915 receives data from the memory 912 based on the information on the address of the input data and the information on the number of input data which are received from the controller 914 to perform a variable node operation. Next, the check node operator 915 stores variable node operation results in the memory 912 based on information on the address of the output data and information on the number of output data which are received from the controller 914. Here, the check node operation is already described with reference to FIG. 5.

The output processor 916 performs a soft decision on whether information word bits of the codeword at the transmitting side are zero (0) or one (1) based on data received from the variable node operator 913 and then outputs soft-decision results, such that an output value of the output processor 916 may be a value which is finally decoded. In this case, in FIG. 5, the soft decision may be performed based on a value obtained by adding all message values (an initial message value and the other message values input from the check node) input to one variable node.

The decoding apparatus 800 may further include a memory (not illustrated) in which information on the code rate, the codeword length, and the parity-check matrix of the LDPC code is previously stored, and the LDPC decoder 810 may perform the LDPC encoding using this information. However, this is only an example, and thus, corresponding information may be provided from the transmitting side. Here, the information on the parity-check matrix may comprise information about an information word sub-matrix which is formed of a plurality of column groups each including M columns and a table showing positions of value one (a) present in every M-th column.

FIG. 10 is a block diagram illustrating a configuration of a receiving apparatus according to an exemplary embodiment. As illustrated in FIG. 10, the receiving apparatus 1000 includes a demodulator 1010, a deinterleaver 1020, an LDPC decoder 1030 and a BCH decoder 1040.

The demodulator 1010 receives and demodulates a signal transmitted from the transmitting apparatus (for example, 700 of FIG. 7). In detail, the demodulator 1010 may demodulate the received signal to generate a value corresponding to an LDPC codeword and output a generated value to the deinterleaver 1020.

In this case, the value corresponding to the LDPC codeword may be represented by a channel value for the received signal. Here, a method for determining the channel value may be various and may be a method for determining an LLR value as one example.

The deinterleaver 1020 may perform deinterleaving on output values of the demodulator 1010 and output deinterleaved output values to the LDPC decoder 1030.

In detail, the deinterleaver 1020 is a component corresponding to the interleaver 730 of the transmitting apparatus 700 and may perform an operation corresponding to the interleaver 730. That is, the deinterleaver 1020 may inversely apply the interleaving scheme applied to the interleaver 730 to deinterleave LLR values output from the demodulator 1010.

However, in some cases, when the interleaver 730 is omitted in the transmitting apparatus 700, the deinterleaver 1020 may be omitted.

The LDPC decoder 1030 may use output values of the deinterleaver 1020 to perform the LDPC decoding and output LDPC decoded bits to the BCH decoder 1040. Here, the LDPC decoded bits may be a BCH codeword.

In detail, the LDPC decoder 1030 is a component corresponding to the LDPC encoder 720 of the transmitting apparatus 700, and may perform the LDPC decoding based on a parity-check matrix. The LDPC decoder 1030 of FIG. 10 may be implemented as the LDPC decoder 810 described with reference to FIG. 8. That is, the LDPC decoder 1030 may perform the LDPC decoding using the parity-check matrix in which an information word sub-matrix is defined by above Tables 9 to 18 depending on a code rate and the parity sub-matrix has a dual diagonal structure.

The BCH decoder 1040 may perform the BCH decoding on values output from the LDPC decoder 1030.

In detail, the BCH decoder 1040 is a component corresponding to the BCH encoder 710 of the transmitting apparatus 700 and may perform the BCH decoding on a BCH codeword output from the LDPC decoder 1030 to generate the bits transmitted from the transmitting apparatus 700. However, in some cases, when the BCH encoder 710 is omitted in the transmitting apparatus 700, the BCH decoder 1040 may be omitted.

The receiving apparatus 1000 may pre-store various parameters which are used for decoding and interleaving. Here, the parameters used for decoding may be information on a code rate and a codeword length of the BCH code and information on a code rate, a codeword length and a parity-check matrix of the LDPC code. Further, the parameters used for deinterleaving may be information on a deinterleaving rule. Here, the information on the parity-check matrix may comprise information about an information word sub-matrix which is formed of a plurality of column groups each including M columns and a table showing positions of value one (1) present in every M-th column.

In this case, each component configuring the receiving apparatus 1000 may be operated using the parameters.

Meanwhile, although not illustrated, in some cases, the receiving apparatus 1000 may further include a controller (not illustrated) for controlling an operation of the receiving apparatus 1000.

In this case, the controller (not illustrated) may provide the information on the code rate and the codeword length of the BCH codes to the BCH decoder 1040 and provide the information on the code rate, the codeword length, the parity-check matrix of the LDPC codes to the LDPC decoder 1030. Further, the controller (not illustrated) may also provide the information on the interleaving scheme to the deinterleaver 1020. Here, the information on the parity-check matrix may comprise the information regarding information word sub-matrix which is formed of the plurality of column groups each including M columns and a table showing positions of value one (a) present in every M-th column.

Figure 11:
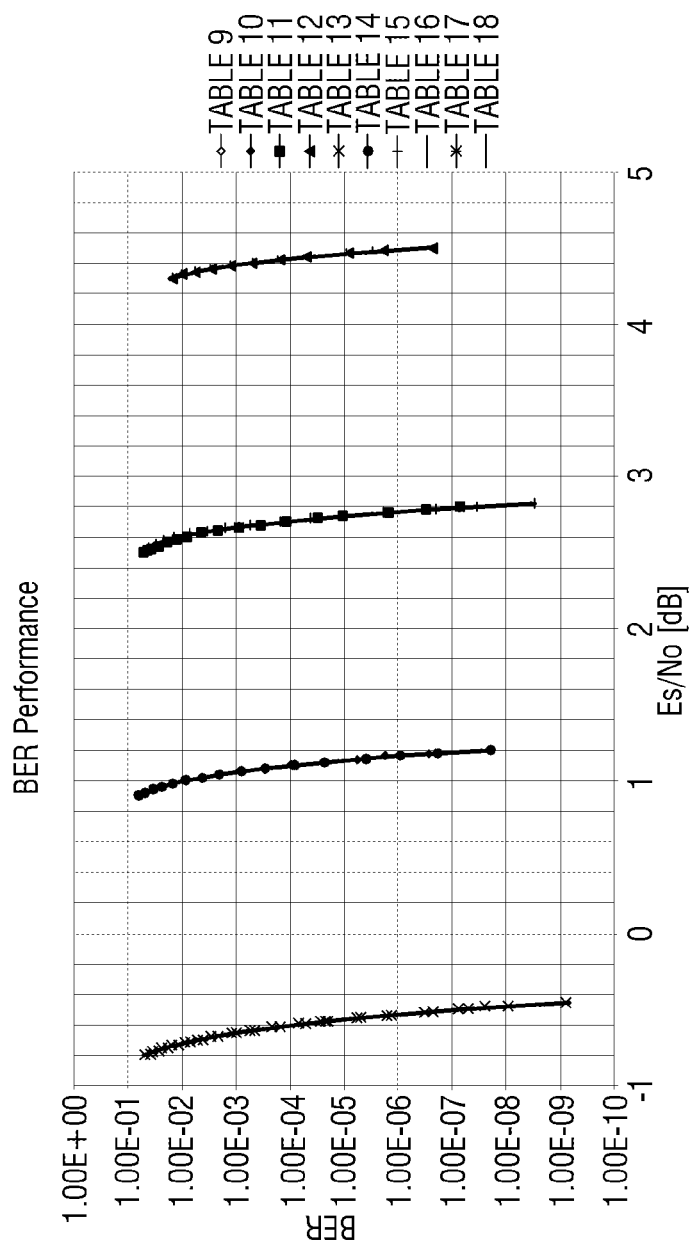
FIGS. 11 and 12 are diagrams for describing an effect generated at the time of performing LDPC encoding, according to exemplary embodiments.
Figure 12:
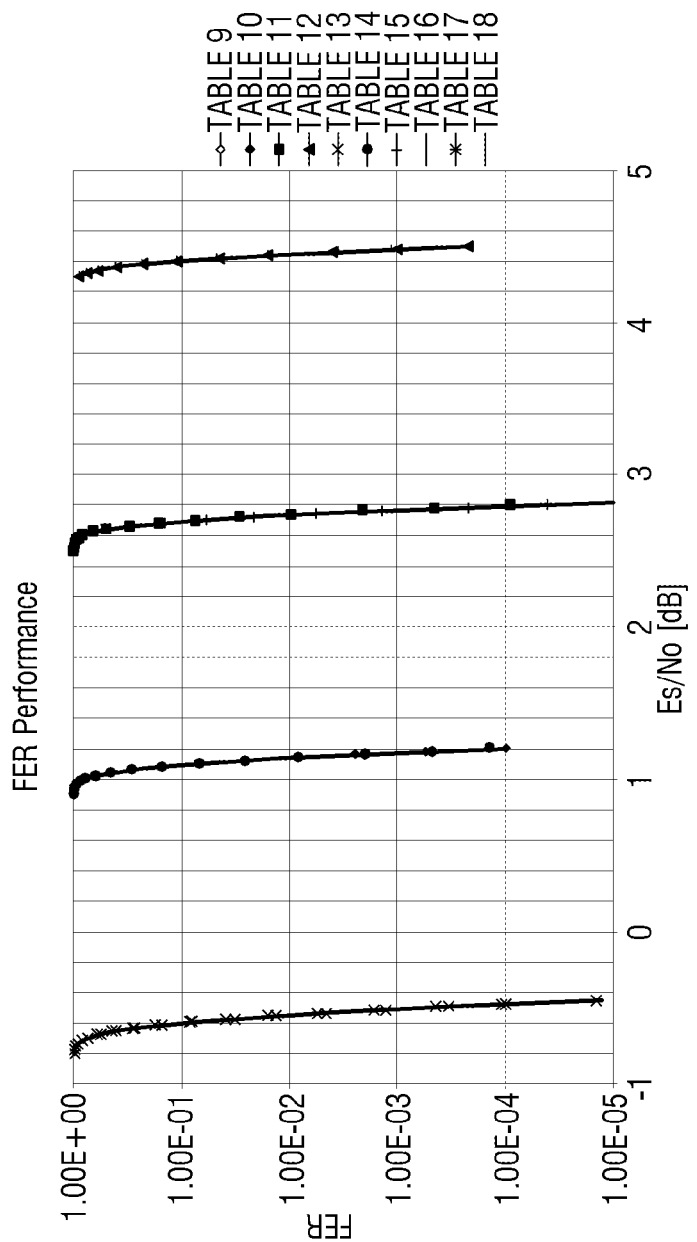

FIGS. 11 and 12 are diagrams for describing performances of LDPC codes according to an exemplary embodiment.

FIG. 11 is a graph illustrating a BER performance of the LDPC codes according to an exemplary embodiment. In detail, each curve represents a BER performance to Es/No when the LDPC encoding is performed based on above Tables 9 to 18.

FIG. 12 is a graph illustrating an FER performance of the LDPC codes according to an exemplary embodiment. In detail, each curve represents an FER performance to Es/No when the LDPC encoding is performed based on above Tables 9 to 18.

As described above, when the LDPC encoding is performed based on the parity-check matrix defined according to the above exemplary embodiments, it may be appreciated that the BER/FER performance is improved.

Figure 13:
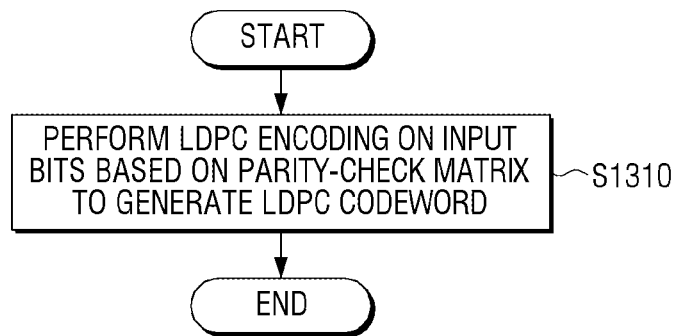
FIG. 13 is a flow chart for describing an encoding method, according to an exemplary embodiment.

FIG. 13 is a flow chart for describing an encoding method according to an exemplary embodiment. In detail, FIG. 13 is a diagram for describing an encoding method of an encoding apparatus for performing low density parity check (LDPC) encoding.

First, the LDPC encoding is performed on input bits based on a parity-check matrix to generate an LDPC codeword (S1310). In this case, the LDPC codeword may be formed of 64800 bits. That is, the LDPC codeword length may be 64800.

Meanwhile, the parity-check matrix may have the same form as that of the parity-check matrix 300 illustrated in FIG. 3.

In detail, the parity-check matrix includes the information word sub-matrix and the parity sub-matrix described above.

Here, the information word sub-matrix is formed of a plurality of column groups each including M columns and may be defined by a table indicating positions of value one (1) present in every M-th column. Here, M, which is an interval at which patterns of columns are repeated in the information word sub-matrix, may be 360. In addition, the parity sub-matrix may have a dual diagonal structure.

In this case, in S1310, the LDPC encoding may be performed using parity-check matrices which are differently defined depending on a code rate.

For example, the LDPC encoding may be performed using parity-check matrices defined by a table such as above Tables 9, 13 and 17 when the code rate is 6/15 and the LDPC encoding may be performed using parity-check matrices defined by a table such as above Tables 10 and 14 when the code rate is 8/15. Further, the LDPC encoding may be performed using parity-check matrices defined by a table such as above Tables 11, 15 and 18 when the code rate is 10/15 and the LDPC encoding may be performed using parity-check matrices defined by a table such as above Tables 12 and 16 when the code rate is 12/15.

Meanwhile, a detailed method for performing the LDPC encoding is already described, and thus, duplicate descriptions thereof will be omitted.

Figure 14:
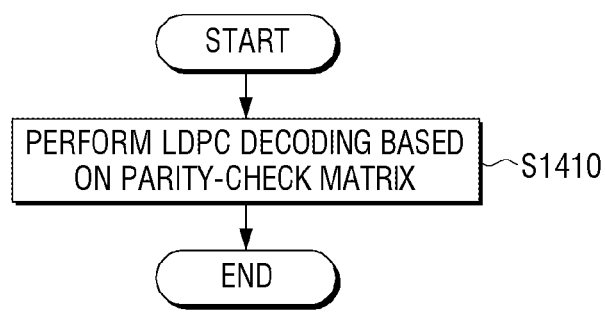
FIG. 14 is a flow chart for describing a decoding method, according to an exemplary embodiment.

FIG. 14 is a flow chart for describing a decoding method according to an exemplary embodiment. In detail, FIG. 14 is a diagram for describing the decoding method of a decoding apparatus for performing low density parity check (LDPC) decoding.

First, the LDPC decoding is performed on an LDPC codeword based on a parity-check matrix (S1410). Here, the LDPC codeword may be formed of 64800 bits. That is, the LDPC codeword length may be 64800.

For example, the LDPC decoding may be performed by passing LLR values corresponding to the LDPC codeword bits through an iterative decoding algorithm to generate information word bits.

Here, the LLR values may be represented by channel values corresponding to the LDPC codeword bits by various methods.

For example, the LLR values may be represented by values obtained by taking a log on a ratio of a probability that bits transmitted through a channel at the transmitting side are zero (0) and a probability that bits are one (1). Further, the LLR values may be bit values determined by a soft decision and may also be a representative value determined depending on a section to which the probability that the bits transmitted from the transmitting side are zero (0) or one (1) belongs.

In this case, the transmitting side may use the LDPC encoder 610 as illustrated in FIG. 6 to generate and transmit the LDPC codeword.

Meanwhile, the parity-check matrix may have the same form as that of the parity-check matrix 300 illustrated in FIG. 3.

In detail, the parity-check matrix includes the information word sub-matrix and the parity sub-matrix as described above.

Here, the information word sub-matrix is formed of a plurality of column groups each including M columns and may be defined by a table indicating positions of value one (1) present in every M-th column. Here, M, which is an interval at which patterns of columns are repeated in the information word sub-matrix, may be 360. In addition, the parity sub-matrix may have a dual diagonal structure.

In this case, in S1410, the LDPC decoding may be performed using parity-check matrices which are differently defined depending on a code rate R.

For example, the LDPC decoding may be performed using parity-check matrices defined by a table such as above Tables 9, 13 and 17 when the code rate is 6/15 and the LDPC decoding may be performed using parity-check matrices defined by a table such as above Tables 10 and 14 when the code rate is 8/15. Further, the LDPC decoding may be performed using parity-check matrices defined by a table such as above Tables 11, 15 and 18 when the code rate is 10/15 and the LDPC decoding may be performed using parity-check matrices defined by a table such as above Tables 12 and 16 when the code rate is 12/15.

Meanwhile, the detailed method for performing the LDPC decoding is already described, and thus, duplicate descriptions thereof will be omitted.

A non-transitory computer readable medium in which programs sequentially performing the encoding method and the decoding method according to the above exemplary embodiments are stored may be provided.

The non-transitory computer readable medium is not a medium such as a register, a cache, and a memory which may store data for a short period of time but a medium which may semi-permanently store data and read by equipment. In detail, various applications or programs as described above may be stored and provided in the non-transitory computer readable medium such as a compact disc (CD), a digital versatile disc (DVD), a hard disk, a Blu-ray disk, a universal serial bus (USB), a memory card, and a read-only memory (ROM).

Further, in the foregoing block diagram illustrating the encoding apparatus, the decoding apparatus, the transmitting apparatus, and the receiving apparatus, a bus is not illustrated, but communication between each component in the encoding apparatus, the decoding apparatus, the transmitting apparatus, and the receiving apparatus may be made through the bus.

Components, elements or units represented by a block as illustrated in FIGS. 6-10 may be embodied as the various numbers of hardware, software and/or firmware structures that execute respective functions described above, according to exemplary embodiments. For example, these components, elements or units may use a direct circuit structure, such as a memory, processing, logic, a look-up table, etc. that may execute the respective functions through controls of one or more microprocessors or other control apparatuses. These components, elements or units may be specifically embodied by a module, a program, or a part of code, which contains one or more executable instructions for performing specified logic functions. Also, at least one of the above components, elements or units may further include a processor such as a central processing unit (CPU) that performs the respective functions, a microprocessor, or the like.

As described above, according to the exemplary embodiments, the LDPC encoding and decoding performance may be improved.

Hereinabove, although various exemplary embodiments of the inventive concept are illustrated and described, the inventive concept is not limited to the aforementioned exemplary embodiment and it is apparent that various modifications can be made to those skilled in the art without departing from the spirit of the inventive concept described in the appended claims and the modified embodiments are not to be individually understood from the technical spirit and prospects of the inventive concept.

What is claimed is:

1. A receiving apparatus comprising:
a receiver configured to receive a signal from a transmitting apparatus;
a demodulator configured to demodulate the signal to generate values;
a deinterleaver configured to deinterleave the values; and
a decoder configured to decode the deinterleaved values based on a parity check matrix of a low density parity check (LDPC) code,
wherein the parity check matrix comprises an information sub matrix and a parity sub matrix,
wherein the information sub matrix is obtained based on a quasi-cyclic matrix,
wherein positions of weight–1 in the information sub matrix are determined based on a number of quasi-cyclic matrices, a location of the quasi-cyclic matrix and a cyclic shift value of the quasi-cyclic matrix, and
wherein the cyclic shift value is determined based on a cycle characteristic and a degree distribution.

2. A receiving method comprising:
receiving a signal from a transmitting apparatus;
demodulating the signal to generate values;
deinterleaving the values; and
decoding the deinterleaved values based on a parity check matrix of a low density parity check (LDPC) code,
wherein the parity check matrix comprises an information sub matrix and a parity sub matrix,
wherein the information sub matrix is obtained based on a quasi-cyclic matrix,
wherein positions of weight–1 in the information sub matrix are determined based on a number of quasi-cyclic matrices, a location of the quasi-cyclic matrix and a cyclic shift value of the quasi-cyclic matrix, and
wherein the cyclic shift value is determined based on a cycle characteristic and a degree distribution.

* * * * *